United States Patent
Iwafuchi et al.

(10) Patent No.: US 9,105,541 B2
(45) Date of Patent: Aug. 11, 2015

(54) SOLID-STATE IMAGING APPARATUS

(71) Applicant: Sony Corporation, Tokyo (JP)

(72) Inventors: Toshiaki Iwafuchi, Kanagawa (JP);
Masahiko Shimizu, Kanagawa (JP);
Hirotaka Kobayashi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/317,781

(22) Filed: Jun. 27, 2014

(65) Prior Publication Data

US 2014/0306310 A1    Oct. 16, 2014

Related U.S. Application Data

(63) Continuation of application No. 13/357,883, filed on Jan. 25, 2012, now Pat. No. 8,786,041.

(30) Foreign Application Priority Data

Feb. 18, 2011   (JP) .................................. 2011-033690
May 10, 2011   (JP) .................................. 2011-105241

(51) Int. Cl.
 *H01L 27/146*    (2006.01)
(52) U.S. Cl.
 CPC .... *H01L 27/14627* (2013.01); *H01L 27/14618* (2013.01); *H01L 27/14623* (2013.01); *H01L 27/14625* (2013.01)
(58) Field of Classification Search
 CPC .................. H01L 27/14618; H01L 27/14627;
  H01L 27/14625; H01L 2224/48091; H01L
  27/14621; H01L 27/14685; H04N 5/2257;
  H04N 5/2253; H04N 5/2254
 USPC ................................................... 257/431–435
 See application file for complete search history.

(56) References Cited

U.S. PATENT DOCUMENTS

| | | | |
|---|---|---|---|
| 2008/0089068 A1* | 4/2008 | Mimura et al. | 362/292 |
| 2010/0032781 A1* | 2/2010 | Ryu | 257/432 |
| 2010/0176476 A1* | 7/2010 | Takayama et al. | 257/432 |
| 2010/0208132 A1* | 8/2010 | Shiraishi | 348/374 |
| 2011/0050988 A1* | 3/2011 | Yano et al. | 348/374 |
| 2011/0058077 A1* | 3/2011 | Ono | 348/294 |
| 2012/0211853 A1  | 8/2012 | Shimizu et al. | |

FOREIGN PATENT DOCUMENTS

| | | |
|---|---|---|
| JP | 5-38916 U    | 5/1993 |
| JP | 2001-274370 A | 10/2001 |

(Continued)

OTHER PUBLICATIONS

Japanese Office Action issued in Japanese Application No. 2011-105241 on Mar. 3, 2015 (w/ English Translation).

*Primary Examiner* — David Vu
*Assistant Examiner* — Jonathan Han
(74) *Attorney, Agent, or Firm* — Oblon, McClelland, Maier & Neustadt, L.L.P.

(57) ABSTRACT

A solid-state imaging apparatus includes: a solid-state imaging device photoelectrically converting light taken by a lens; and a light shielding member shielding part of light incident on the solid-state imaging device from the lens, wherein an angle made between an edge surface of the light shielding member and an optical axis direction of the lens is larger than an incident angle of light to be incident on an edge portion of the light shielding member.

34 Claims, 21 Drawing Sheets

(56) References Cited

FOREIGN PATENT DOCUMENTS

| JP | 2004-241495 A | 8/2004 |
|----|---------------|--------|
| JP | 2006-41183 A | 2/2006 |
| JP | 2006-222249 | 8/2006 |
| JP | 2006-222249 A | 8/2006 |
| JP | 2008-193441 A | 8/2008 |
| JP | 2009-111334 A | 5/2009 |
| JP | 2010-40672 A | 2/2010 |

* cited by examiner

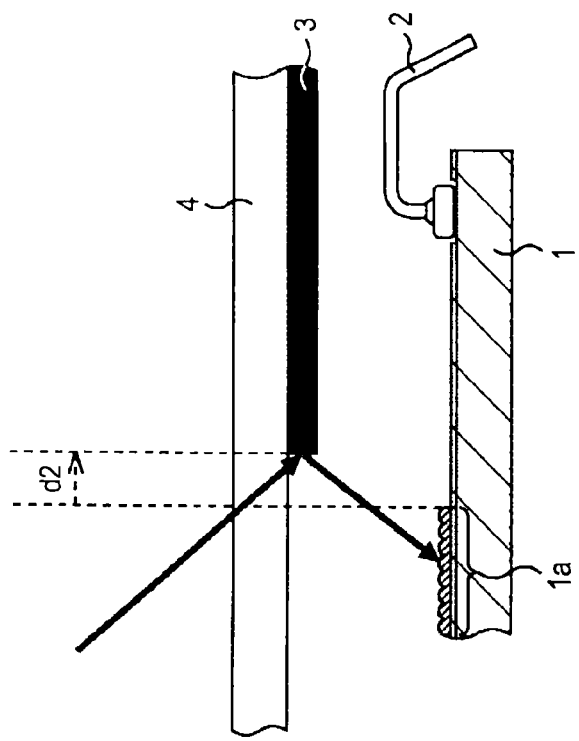
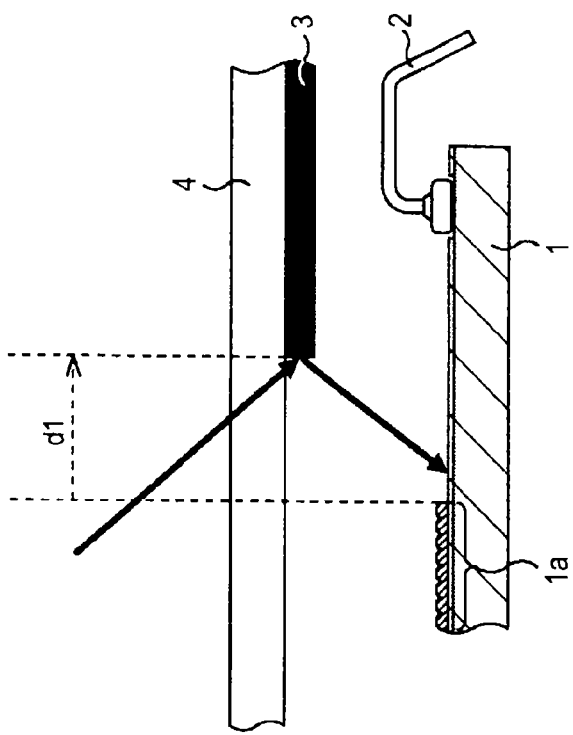
FIG.1

MATERIAL FOR PRINTING

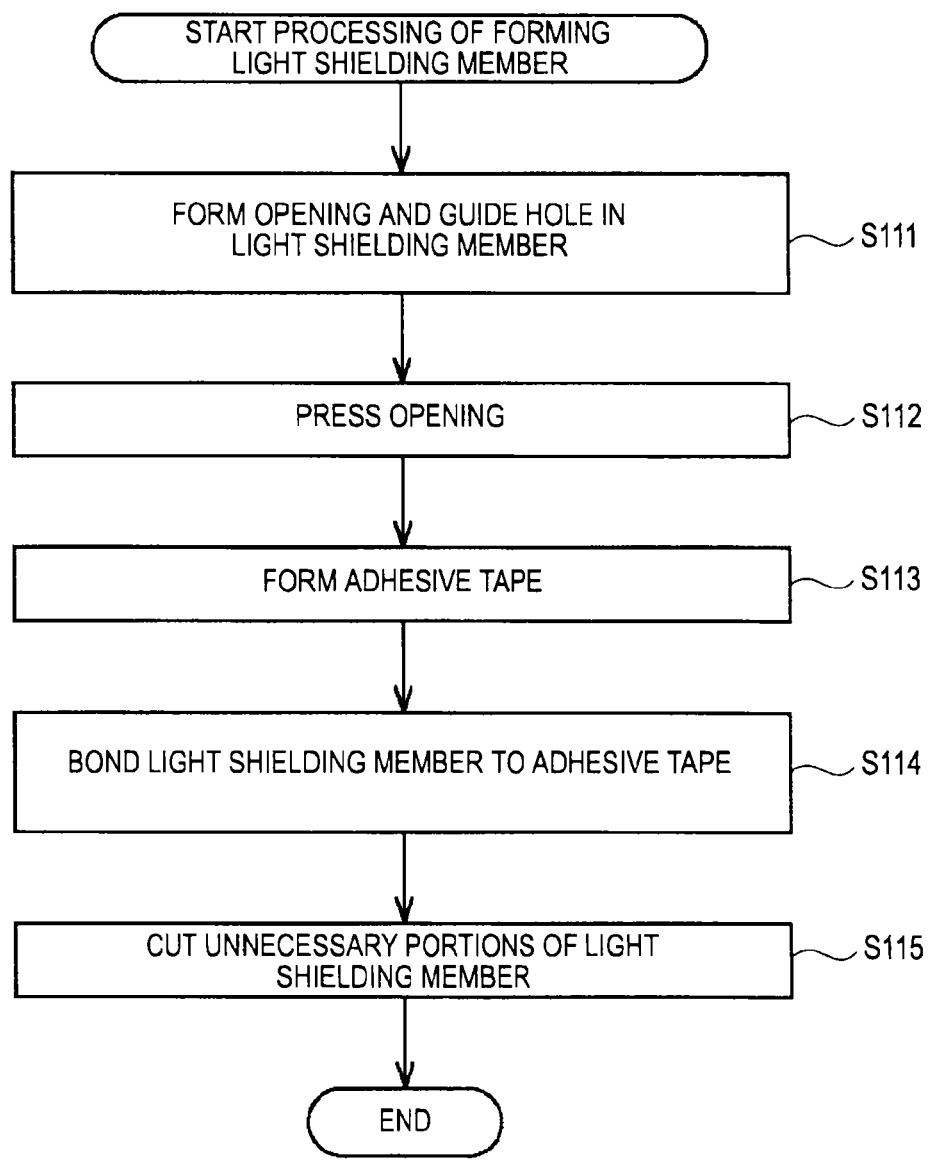

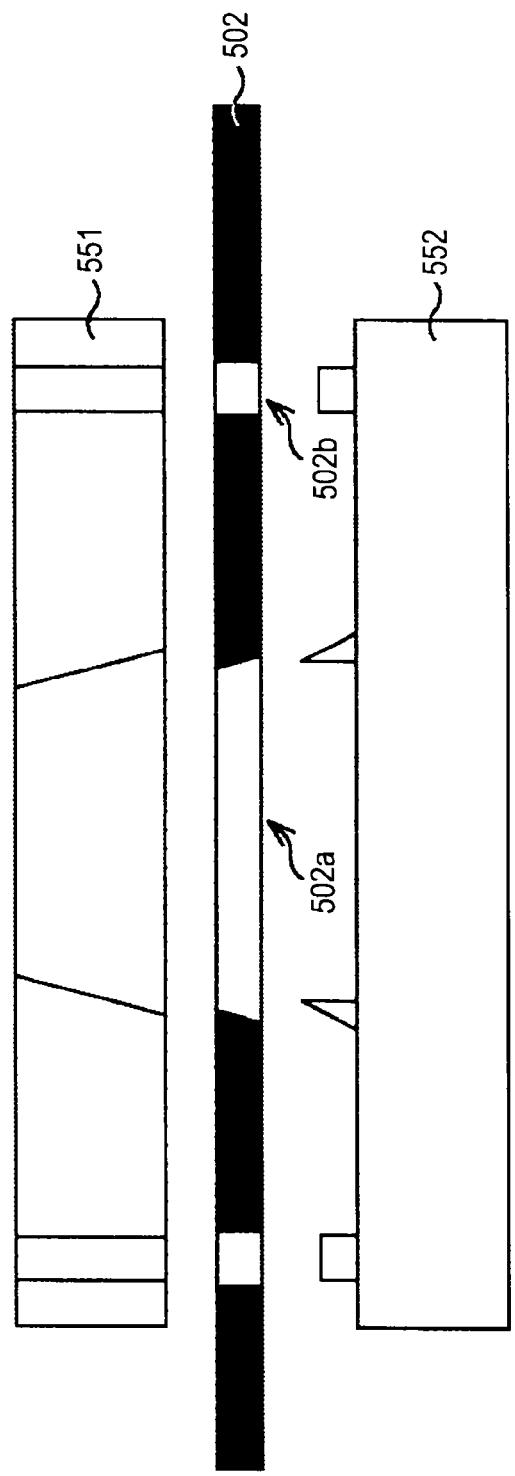
FIG.20A
FIG.20B

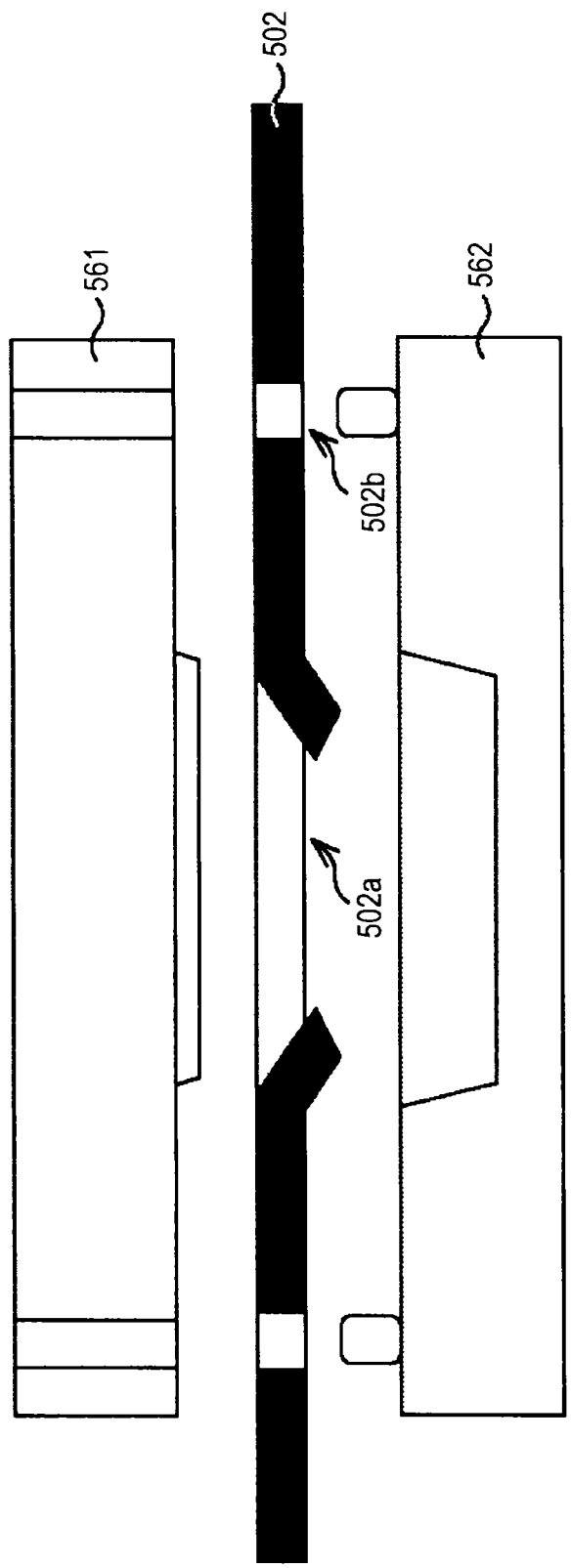

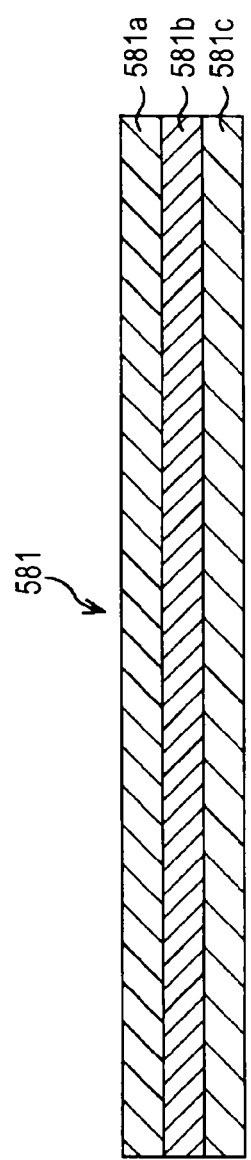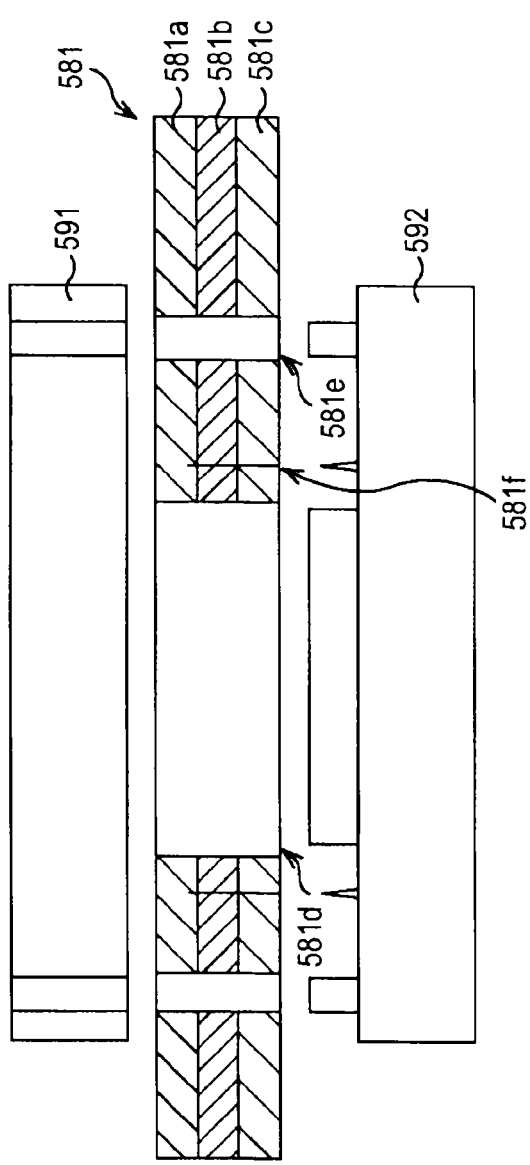

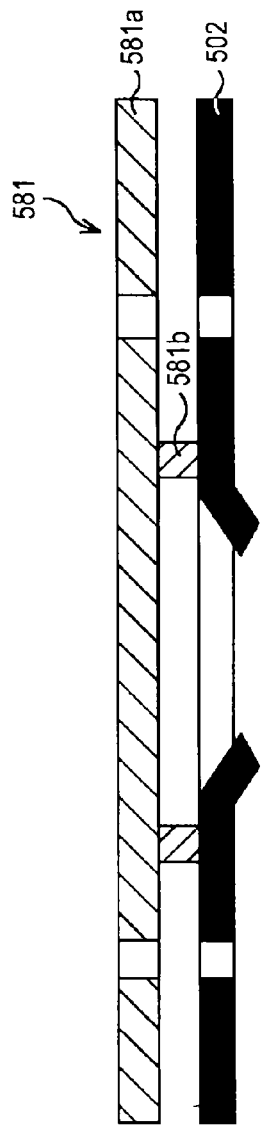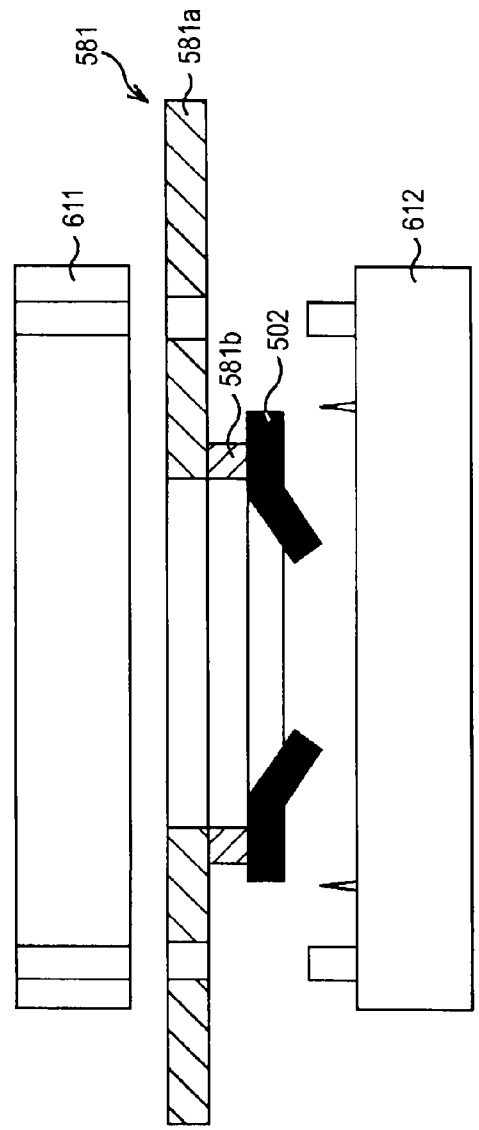
FIG.24A
FIG.24B

SOLID-STATE IMAGING APPARATUS

CROSS-REFERENCE TO RELATED APPLICATIONS

This application is a continuation of U.S. patent application Ser. No. 13/357,883 filed Jan. 25, 2012, the entire contents of which is incorporated herein by reference. U.S. patent application Ser. No. 13/357,883 is based upon and claims the benefit of priority from Japanese Patent Application Nos. 2011-033690 and 2011-105241 filed Feb. 18, 2011 and May 10, 2011, respectively.

FIELD

The present disclosure relates to a solid-state imaging apparatus and particularly relates to a solid-state imaging apparatus capable of suppressing generation of flare and ghost.

BACKGROUND

In recent years, chip shrink tends to make progress due to introduction of a leading-edge process also in an image sensor in the solid-state imaging apparatus in the same manner as other semiconductor chips. Accordingly, it is possible to consider to design the image sensor so that bonding pads are arranged within a lens effective diameter when designing the solid-state imaging apparatus in which the image sensor is connected to a substrate by wire bonding.

However, in such case, there is a danger of generating flare or ghost as light incident from the lens is reflected on surfaces of wires (metal wires) connected to the bonding pads and enters a light receiving surface on the image sensor.

In respond to this, there is disclosed a solid-state imaging apparatus which includes a light shielding member for shielding light in light from the lens incident on the periphery of the bonding pads arranged on the image sensor (for example, JP-A-2006-222249 (Patent Document 1)).

According to the above, it is possible to suppress flare and ghost caused by light incident from the lens being reflected on the surfaces of the metal wires connected to the bonding pads and entering the light receiving surface on the image sensor.

SUMMARY

In manufacturing processes of the solid-state imaging apparatus, a position of the light shielding member in the image sensor has given variation with respect to the position on design.

For example, as shown on the left of FIG. 1, when a distance between an end portion of a light receiving surface 1a of an image sensor 1 and an edge portion of an opening of a light shielding member 3 bonded to a surface of an IRCF (Infrared Ray Cut Filter) 4 facing the image sensor 1 is "d1", incident light represented by a bold arrow is shielded by the light shielding member 3 and does not reach a metal wire 2. Even when the incident light is reflected on an edge surface of the opening of the light shielding member 3, the reflected light does not reach the light receiving surface 1a of the image sensor 1. Assume that the incident light represented by the bold arrow in the drawing is light whose incident angle on the image sensor 1 is the largest of incident light from a not-shown lens. Also, assume that the edge surface of the opening of the light shielding member 3 is parallel to an optical axis direction (direction from top to bottom in the drawing) of the lens.

On the other hand, as shown on the right of FIG. 1, the distance between the end portion of the light receiving surface 1a of the image sensor 1 and the edge portion of the opening of the light receiving member 3 is "d2", incident light represented by a bold arrow is shielded by the light shielding member 3 and does not reach the metal wire 2. However, when the incident light is reflected on the edge surface of the opening of the light shielding member 3, the reflected light enters the light receiving surface 1a on the image sensor 1.

In this case, flare or ghost caused by reflected light from the surface of the metal wire 2 connected to the bonding pad can be suppressed, however, flare or ghost is caused due to reflected light from the edge surface of the opening of the light shielding member 3.

In view of the above, it is desirable to suppress generation of flare and ghost.

An embodiment of the present disclosure is directed to a solid-state imaging apparatus including a solid-state imaging device photoelectrically converting light taken by a lens, and a light shielding member shielding part of light incident on the solid-state imaging device from the lens, in which an angle made between an edge surface of the light shielding member and an optical axis direction of the lens is larger than an incident angle of light to be incident on the edge surface of the light shielding member.

The angle made between the edge surface of the light shielding member and the optical axis direction of the lens may be larger than the incident angle of light whose incident angle is the largest of light incident on an edge portion of the light shielding member.

Pads to which metal wires connected to a substrate are connected may be provided at an peripheral portion of a light receiving surface of the solid-state imaging device, and it is possible that the pads are not arranged on an area closer to the light receiving surface in areas defined by an intersection between a surface of the solid-state imaging device and a virtual extension surface of the edge surface of the light shielding member.

The light receiving surface of the solid-state imaging device receives light incident from an opening of the substrate having the opening, and it is possible that an edge surface of the opening does not intersect the virtual extension surface of the edge surface of the light shielding member.

The solid-state imaging apparatus may further include a sealing member sealing a gap on the light receiving surface of the solid-state imaging device, in which the light shielding member may be provided on a surface of the sealing member facing the lens or a surface thereof facing the solid-state imaging device.

A side surface of the sealing member may be configured not to intersect the virtual extension surface of the edge surface of the light shielding member.

The shielding member may be formed by printing a material for printing on an optical filter arranged on an optical path once or plural times.

According to the embodiment of the present disclosure, the angle made between the edge surface of the light shielding member and the optical axis direction of the lens is allowed to be larger than the incident angle of light to be incident on the edge portion of the light shielding member.

According to the embodiment of the present disclosure, generation of flare and ghost can be suppressed.

BRIEF DESCRIPTION OF THE DRAWINGS

FIG. 1 is views for explaining reflection on an edge surface of an opening of a related-art light shielding member;

FIG. 19 is a flowchart for explaining processing of forming the light shielding member by metal molds;

FIGS. 20A and 20B are views for explaining formation of the light shielding member by metal molds;

FIG. 21 is a view for explaining formation of the light shielding member by metal molds;

FIGS. 22A and 22B are views for explaining formation of the light shielding member by metal molds;

FIGS. 24A and 24B are views for explaining formation of the light shielding member by metal molds.

DETAILED DESCRIPTION

Hereinafter, an embodiment of the present disclosure will be explained with reference to the drawings. The explanation will be made in the following order.

1. Solid-state imaging apparatus of a wire bonding structure
2. Solid-state imaging apparatus of a flip-chip structure
3. Example of a solid-state imaging apparatus in which cavity-less is realized
4. Example of forming a light shielding member by metal molds <1. Solid-State Imaging Apparatus of a Wire Bonding Structure>

[Exterior Structure of a Solid-State Imaging Apparatus]

Figure 2:
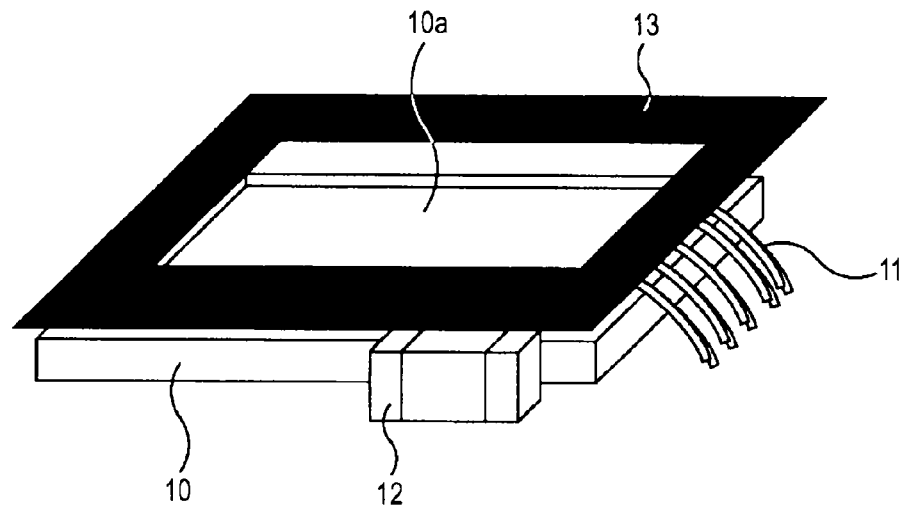
FIG. 2 is a view showing an example of an exterior structure of a solid-state imaging device to which the present disclosure is applied.

FIG. 2 is a view showing a structure of a solid-state imaging device according to an embodiment to which the present disclosure is applied.

A solid-state imaging apparatus of FIG. 2 includes a CMOS image sensor 10 (hereinafter referred to merely as the image sensor 10) as an optical sensor, metal wires 11 connecting the image sensor 10 to a not-shown substrate electrically, a passive component 12 mounted on the not-shown substrate and a light shielding member 13 shielding part of light incident on the image sensor 10 from a not-shown lens.

The image sensor 10 has a light receiving surface 10a in which unit pixels (hereinafter referred to merely as pixels) having photoelectric conversion devices are two-dimensionally arranged in a matrix state, detecting a charge amount corresponding to the amount of light incident on the light receiving surface 10a as a physical value on a pixel basis.

Bonding pads which are terminals for connecting metal wires 11 are arranged on a peripheral portion of the image sensor 10 excluding the light receiving surface 10a, and the metal wires 11 connected to the bonding pads are connected to a not-shown substrate by wire bonding.

In the image sensor 10, at least part of the bonding pads is arranged in an effective diameter of a not-shown lens.

Figure 3:
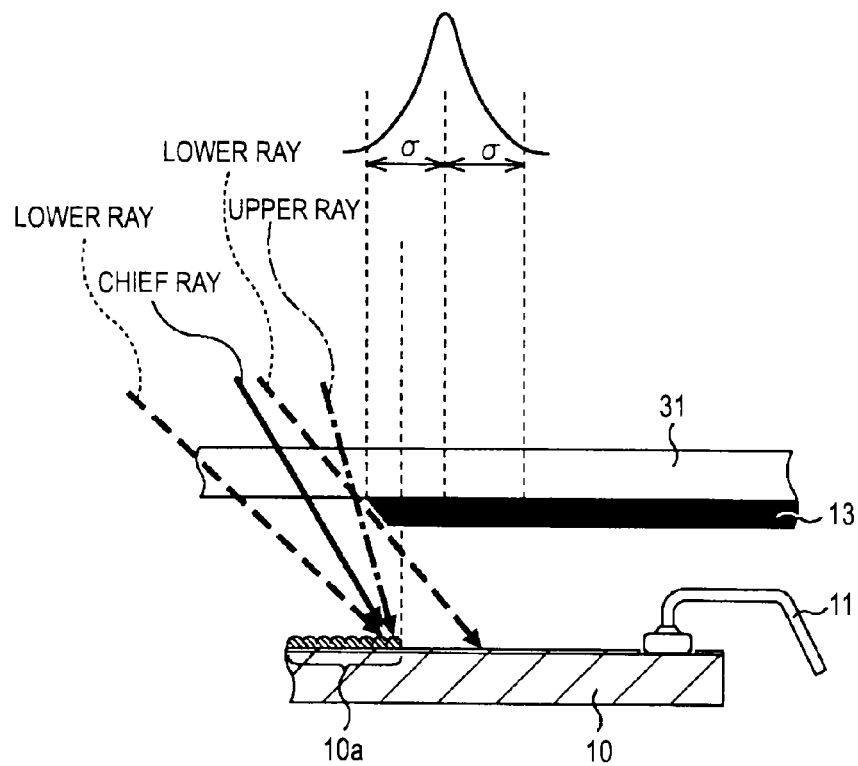
FIG. 3 is a view for explaining a position of a light shielding member and an angle made at an edge surface thereof.
Figure 4:
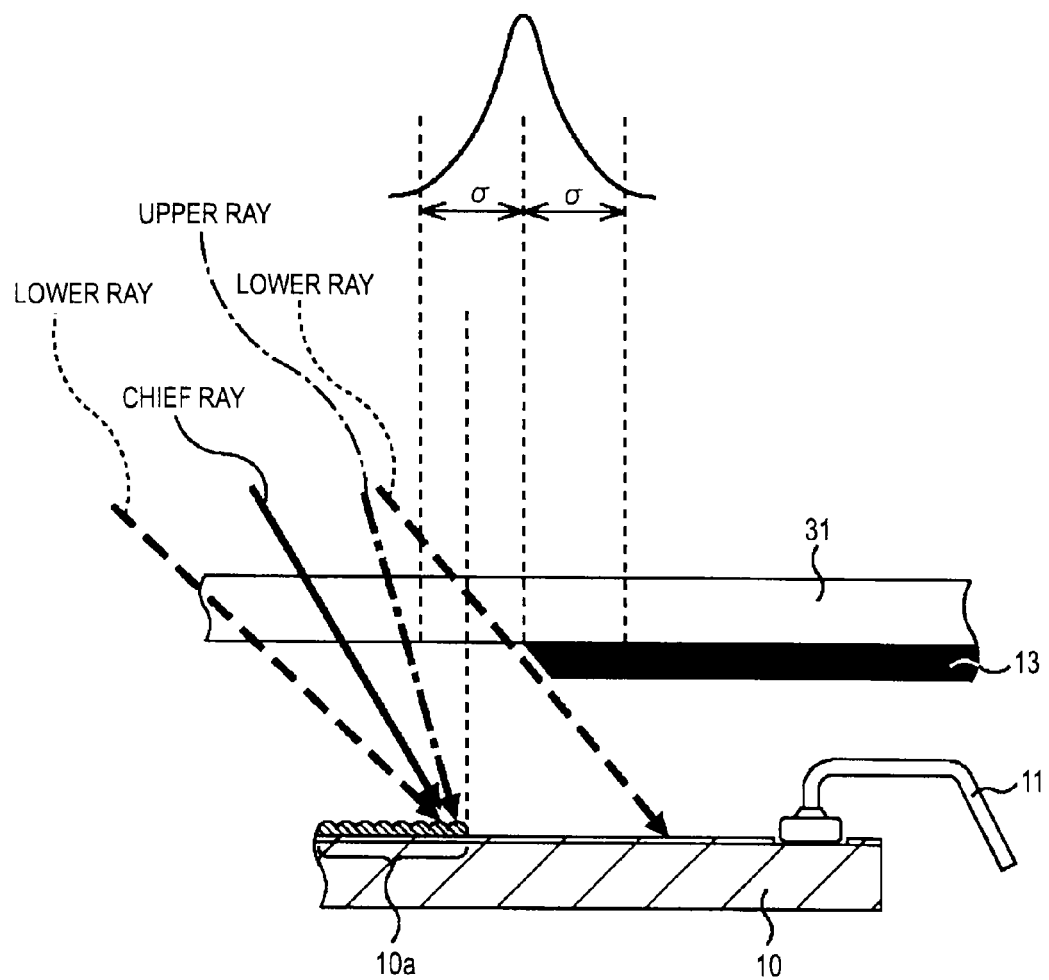
FIG. 4 is a view for explaining the position of the light shielding member and the angle made at the edge surface thereof.
Figure 5:
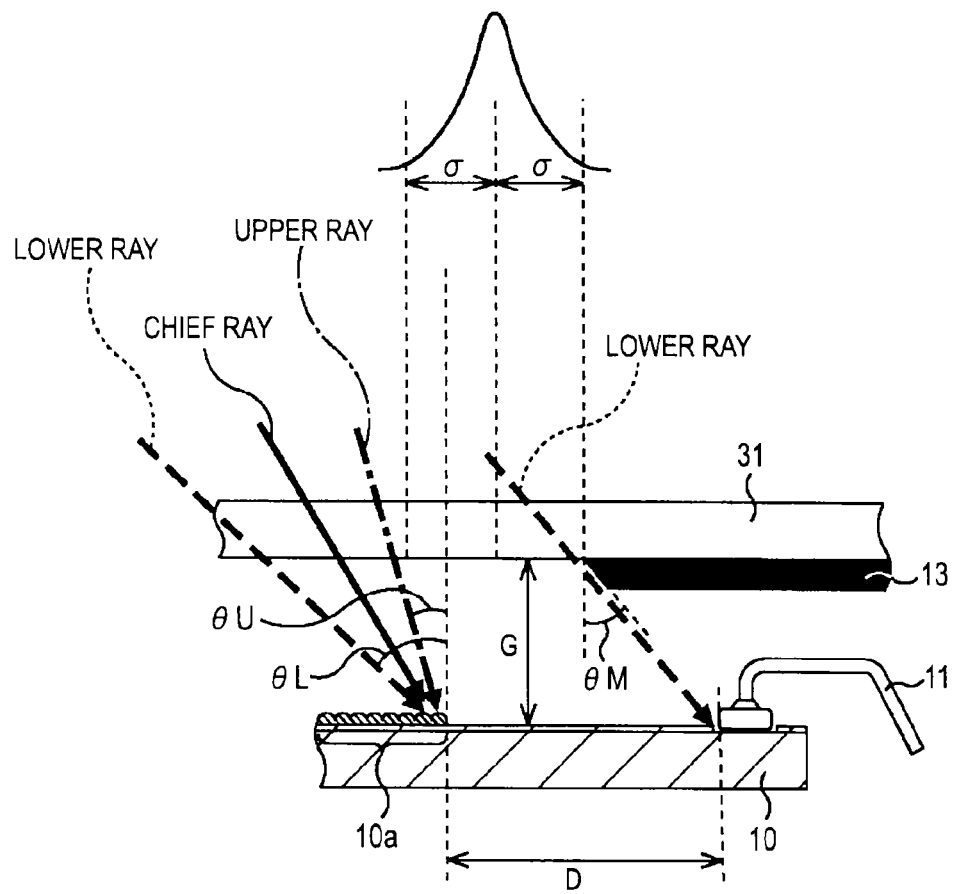
FIG. 5 is a view for explaining the position of the light shielding member and the angle made at the edge surface thereof.

The light shielding member 13 is made of a film having a given thickness and colored black, having an opening through which incident light to be incident on the light receiving surface 10a of the image sensor 10 from the not-shown lens. The light shielding member 13 is arranged on an optical path between the lens and the image sensor 10, which is bonded to, for example, a surface of an IRCF (Infrared Ray Cut Filter) 31 facing the image sensor 10, which is an optical filter including an infrared ray absorbing material as shown in FIG. 3 to FIG. 5. This is because there is a danger that incident light from the lens is reflected on a lower surface (surface facing the image sensor 10) of the IRCF 31 to be stray light and causes flare and ghost when the light shielding member 13 is bonded to a surface of the IRCF 31 facing the lens (upper side in the drawing).

Most of the incident light from the lens is incident on the light receiving surface 10a of the image sensor 10 from the opening of the light shielding member 13, however, incident light to be incident on the vicinity of the bonding pads arranged on the peripheral portion of the image sensor 10 in incident light from the lens is shielded by the light shielding member 13.

Accordingly, it is possible to suppress flare and ghost caused by incident light from the lens being reflected on surfaces of the metal wires 11 in the vicinity of the bonding pads and entering the light receiving surface 10a on the image sensor 10.

Furthermore, a given angle is made with respect to the optical axis direction of the lens at the edge surface of the opening of the light shielding member 13, and incident light to be incident on the edge portion of the opening of the light shielding member 13 can be transmitted without being reflected on the edge surface. The angle to be made at the edge surface of the opening of the light shielding member 13 can be obtained by molding the film as the light shielding member 13 by metal molds.

[Positions of the Light Shielding Member and the Angle Made at the Edge Surface]

Here, positions of the light shielding member 13 with respect to the image sensor 10 and the angle to be made at the edge surface of the opening of the light shielding member 13 will be explained with reference to FIG. 3 to FIG. 5. Hereinafter, the edge surface of the opening of the light shielding member 13 is appropriately referred to merely as the edge surface of the light shielding member 13.

The position of the light shielding member 13 with respect to the image sensor 10 varies to some degree, however, the image sensor 10 is manufactured so that the variation will be within a certain range. Curves shown in FIG. 3 to FIG. 5 are distribution curves indicating variation in position of the edge portion (edge surface) of the light shielding member 13. That is, the position of the light shielding member 13 shown in FIG. 4 indicates a position in design and positions of the light shielding member 13 shown in FIG. 3 and FIG. 5 indicate positions shifted from the position in design by the maximum error σ.

When a chief ray from the lens is incident on the light receiving surface 10a of the image sensor 10 at a certain incident angle (CRA: Chief Ray Angle), an upper ray and a lower ray corresponding to the chief ray are incident at respective incident angles.

In FIG. 3, the upper ray corresponding to the chief ray incident on the end portion of the light receiving surface 10a is not shielded by the light shielding member 13, and the chief ray, the upper ray and the lower ray corresponding to the chief ray will be incident on the light receiving surface 10a without exception.

In FIG. 5, the lower ray transmitted without being shielded by the light shielding member 13 is set so as not to be reflected on the metal wires 11.

That is, the position of the light shielding member 13 with respect to the image sensor 10 will be a position where the chief ray, the upper ray and the lower ray corresponding to the chief ray will be incident on the light receiving surface 10a without exception in the edge portion of the opening of the light shielding member 13 as well as the lower ray is not incident on the bonding pads (metal wires 11).

When the edge surface of the light shielding member 13 is angled with respect to the optical axis direction of the lens so that the lower ray whose incident angle is the largest of the chief ray, the upper ray and the lower ray transmits through the edge portion of the opening of the light shielding member 13, incident light is not reflected on the edge surface of the light shielding member 13. That is, an angle made between the edge surface of the light shielding member 13 and the optical axis direction of the lens (hereinafter referred to as an edge surface angle) may be an angle larger than the incident angle of the lower ray to be incident on the edge portion of the opening of the light shielding member 13.

That is, when the edge surface angle is θM and the incident angle of the lower ray is θL, it is preferable to satisfy θM>θL as shown in FIG. 5. The incident angle θL of the lower ray is represented as the following expression (1) when an incident angle θU of the upper ray, a distance D between the edge portion of the light receiving surface 10a and the bonding pad and a distance (gap length) G between the IRCF 31 and the surface of the image sensor 10 are used.

$$\theta L = \arctan\left[\tan \theta U + \{(D-2\sigma)/G\}\right] \quad (1)$$

Accordingly, the edge surface angle θM will be given so as to satisfy the following expression (2).

$$\theta M > \arctan\left[\tan \theta U + \{(D-2\sigma)/G\}\right] \quad (2)$$

Specifically, for example, when the CRA of the chief ray is 30 degrees, incident angles of the upper ray and the lower ray corresponding to the chief ray are ±10 degrees of the CRA, therefore, the lower ray is not reflected on the edge surface of the light shielding member 13 by determining the edge surface angle to be 50 degrees including a margin.

Furthermore, the lower ray transmitted through the edge portion of the opening of the light shielding member 13 is not incident on surfaces of the metal wires 11 connected to the bonding pads as described above. In other words, the bonding pads for connecting the metal wires 11 are designed not to be arranged on an area closer to the light receiving surface 10a in areas defined by an intersection between the surface of the image sensor 10 and a virtual extension surface of the edge surface of the light shielding member 13.

According to the above structure, incident light is not reflected on the edge surface of the light shielding member 13, therefore, it is possible to suppress the generation of flare and ghost due to reflected light from the edge surface of the light shielding member 13.

Additionally, the lower ray transmitted through the edge portion of the opening of the light shielding member 13 is not reflected on surfaces of the metal wires 11 connected to the bonding pads, therefore, it is also possible to suppress the generation of flare and ghost due to reflected light from the surfaces of the metal wires 11.

Particularly, as the CRA of the chief ray is increased, the incident angle of the lower ray is also increased in a back-illuminated image sensor. The edge surface of the light shielding member 13 is formed so as to correspond to the incident angle of the lower ray, thereby suppressing generation of flare and ghost.

As the generation of flare and ghost can be suppressed even when at least part of the bonding pads is arranged in the effective diameter of the lens in the image sensor 10, therefore, the chip size of the image sensor 10 can be reduced. Accordingly, the theoretical yield can be increased and costs per one chip can be reduced.

Moreover, the bonding pads can be arranged in the vicinity of the light receiving surface 10a in the image sensor 10, therefore, the scale of peripheral circuits of the image sensor 10 can be also made small, which allows the process generation in the semiconductor chip to make progress. As a result, an image sensor responding to the reduction of power consumption and improvement in operation speed can be provided.

Furthermore, as the chip size of the image sensor 10 can be reduced, the size of a camera module including the image sensor 10 can be also reduced, therefore, the technique can be applied to a cellular phone with a camera in which miniaturization is particularly demanded.

[Materials for the Light Shielding Member]

Though the light shielding member 13 is made of the black-colored film in the above description, the light shielding member 13 can be made of other materials.

Specifically, for example, the light shielding member 13 can be made by printing materials for printing on the IRCF 31. The materials for printing are, for example, a carbon filler, epoxy resin or acrylic resin colored black with dye, an epoxy/acrylic hybrid resin and so on, which have UV curability or heat curability. The materials for printing can be resins having normal-temperature curability. As a printing method of the above materials for printing, a screen printing method, an ink-jet printing method or the like is applied.

[Processing of Forming the Light Shielding Member by Printing]

Here, the processing of forming the light shielding member 13 by printing will be explained with reference to a flowchart of FIG. 6.

In Step S11, the material for printing is printed on the IRCF 31. In Step S12, whether a film thickness is sufficient or not is determined. When it is determined that the film thickness is not sufficient in Step S12, the printed material for printing is cured, then, the process returns to Step S11 and the material for printing is printed again.

On the other hand, when it is determined that the film thickness is sufficient, the printed material for printing is cured, then, the process ends.

In the case where the material for printing has the UV curability, the film thickness will be approximately 14 μm by one printing, therefore, the light shielding member 13 having a film thickness of approximately 50 μm can be obtained by printing of three or four times.

Figure 7:
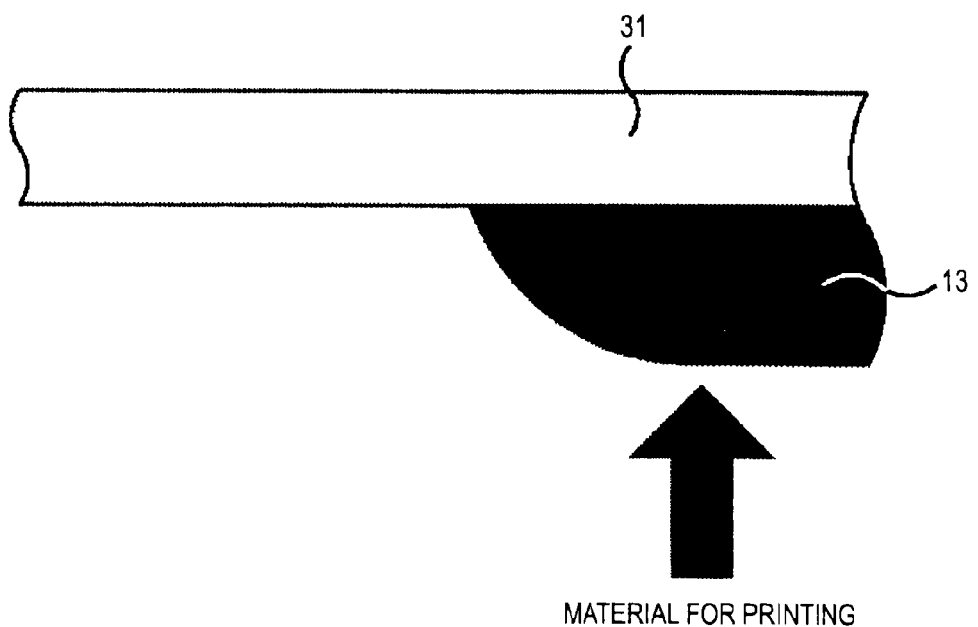
FIG. 7 is a view for explaining printing of a material for printing as the light shielding member.

When the light shielding member 13 is printed by a liquid material for printing, the edge surface angle of the light shielding member 13 is obtained as a contact angle of the material for printing to be prescribed by wettability of the IRCF 31, and a cross section thereof will be as shown in FIG. 7. The edge surface angle can be obtained by a manner of stacking the material for printing in printing of plural times.

Furthermore, the light shielding material 13 can be formed by, for example, depositing a thin film on the IRCF 31. In this case, etching is performed so that side etching is accomplished at the time of patterning the opening with respect to the deposited thin film.

The solid-state imaging apparatus in which the image sensor is connected (mounted) on the substrate by wire bonding has been explained as the above, and a solid-state imaging apparatus having a flip-chip structure will be explained below.

<2. Solid-State Imaging Apparatus of a Flip-Chip Structure>
[Related-Art Solid-State Imaging Apparatus of the Flip-Chip Structure]

Figure 8:
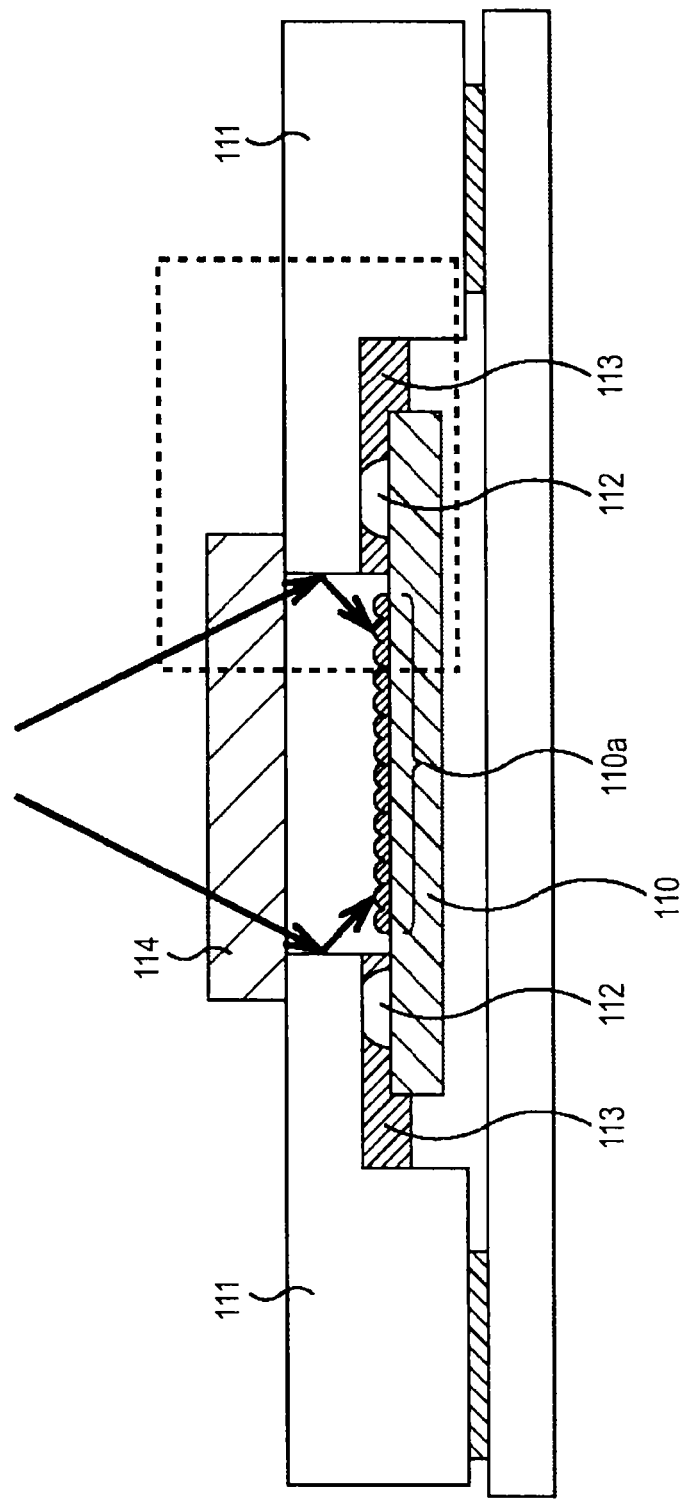
FIG. 8 is a view for explaining reflection on an edge surface of an opening of a substrate of a flip-chip structure.

FIG. 8 is a view showing a structure of a related-art solid-state imaging apparatus of the flip-chip structure.

Figure 9:
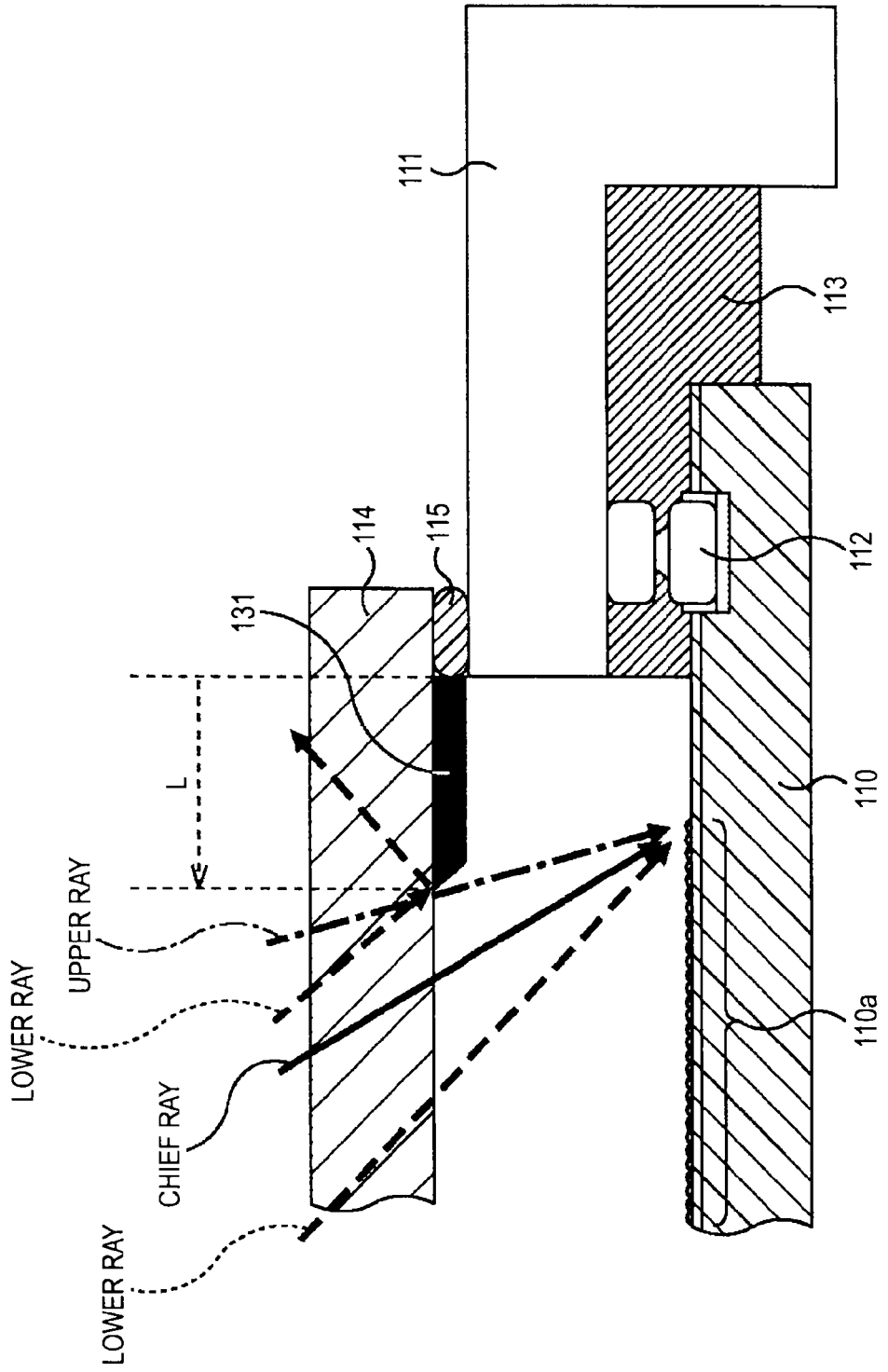
FIG. 9 is a view showing a structure example of a solid-state imaging apparatus of the flip-chip structure to which the present disclosure is applied.

In a solid-state imaging apparatus shown in FIG. 8, a CMOS image sensor 110 (hereinafter referred to merely as the image sensor 110) is electrically connected to a substrate 111 having an opening through bumps 112. Connecting portions between the image sensor 110 and the substrate 111 by the bumps 112 are sealed by an under fill (UF) 113 made of an epoxy resin and so on. On the opening of the substrate 111, a seal glass 114 as a seal member for protecting an upper portion of a light receiving surface 110a of the image sensor 110 is bonded by a UV-curable adhesive member 115 (FIG. 9). The UV-curable adhesive member 115 can be a heat curable member. The seal glass 114 is made of a transparent material transmitting light, and incident light from a not-shown lens represented by bold arrows in the drawing is incident on the light receiving surface 110a of the image sensor 110 through the seal glass 114. The seal glass 114 can be the IRCF. In the solid-state imaging apparatus having the flip-chip structure shown in FIG. 8, a gap is formed between the surface of the seal glass 114 which faces the light receiving surface 110a and the light receiving surface 110a.

In the flip-chip structure, the light receiving surface 110a, the opening of the substrate 111 and an edge surface of the UF 113 are positioned relatively close to one another. Therefore, reflected light reflected on the opening of the substrate 111 or the edge surface of the UF 113 in incident light to be incident through the seal glass 114 enters the light receiving surface 110a, which may cause the generation of flare and ghost.

Accordingly, as shown in FIG. 9, light to be incident on the opening of the substrate 111 and the edge surface of the UF 113 in light from the not-shown lens is shielded by a light shielding member 131 by adhering the light shielding member 131 to the seal glass 114 as shown in FIG. 9.

[Application of the Light Shielding Member to the Flip-Chip Structure]

FIG. 9 is a view showing a structure of a solid-state imaging apparatus having the flip-chip structure according to the embodiment to which the present disclosure is applied. FIG. 9 shows only a structure of a portion corresponding to a portion surrounded by a dotted square frame in the solid-state imaging apparatus of FIG. 8. In the solid-state imaging apparatus of FIG. 9, components corresponding to components of the solid-state imaging apparatus of FIG. 8 are denoted by the same symbols.

In FIG. 9, the light shielding member 131 is made of a film having a given thickness and colored black, having an opening through which light to be incident on the light receiving surface 110a of the image sensor 110 from the not-shown lens in the same manner as the light shielding member 13 of FIG. 2. The light shielding member 131 is bonded to a surface of the seal glass 114 facing the image sensor 110. The light shielding member 131 is made of the black colored film in the above description, however, the light shielding member 131 can be made of materials for printing to be printed on the seal glass 144 as well as made of the thin film to be deposited on the seal glass in the same manner as the light shielding member 13 described above.

In the case where the chief ray is incident on the light receiving surface 110a of the image sensor 110 with a certain CRA, the upper ray and the lower ray corresponding to the chief ray are also incident at respective incident angles.

When the edge surface of the light shielding member 131 is angled with respect to the optical axis direction of the lens so that the lower ray whose incident angle is the largest of the chief ray, the upper ray and the lower ray transmits through the edge portion of the opening of the light shielding member 131, incident light is not reflected on the edge surface of the light shielding member 131. That is, the edge surface angle of the light shielding member 131 will be larger than the incident angle of the lower ray to be incident on the edge portion of the opening of the light shielding member 131.

Additionally, a width L of the light shielding member 131 is designed so that edge surfaces of the opening of the substrate 111 and the UF 113 do not intersect the virtual extension surface of the edge surface of the light shielding member 131. That is, the lower ray transmitted through the edge portion of the opening of the light shielding member 131 is not reflected on the edge surfaces of the opening of the substrate 111 and the UF 113.

According to the above structure, incident light is not reflected on the edge surface of the light shielding member 131 as well as incident light is not reflected on the edge surfaces of the opening of the substrate 111 and the UF 113, therefore, it is possible to suppress the generation of flare and ghost due to reflected light from the edge surface of the light shielding member 131, the edge surface of the opening of the substrate 111 or the edge surface of the UF 113.

Though the seal glass 114 and the opening of the substrate 111 are bonded together by the adhesive member 115 in FIG. 9, it is also preferable that the light shielding member 131 bonds the seal glass 114 and the opening of the substrate 111 by using a material having an adhesive function as the light shielding member 131.

Figure 10:
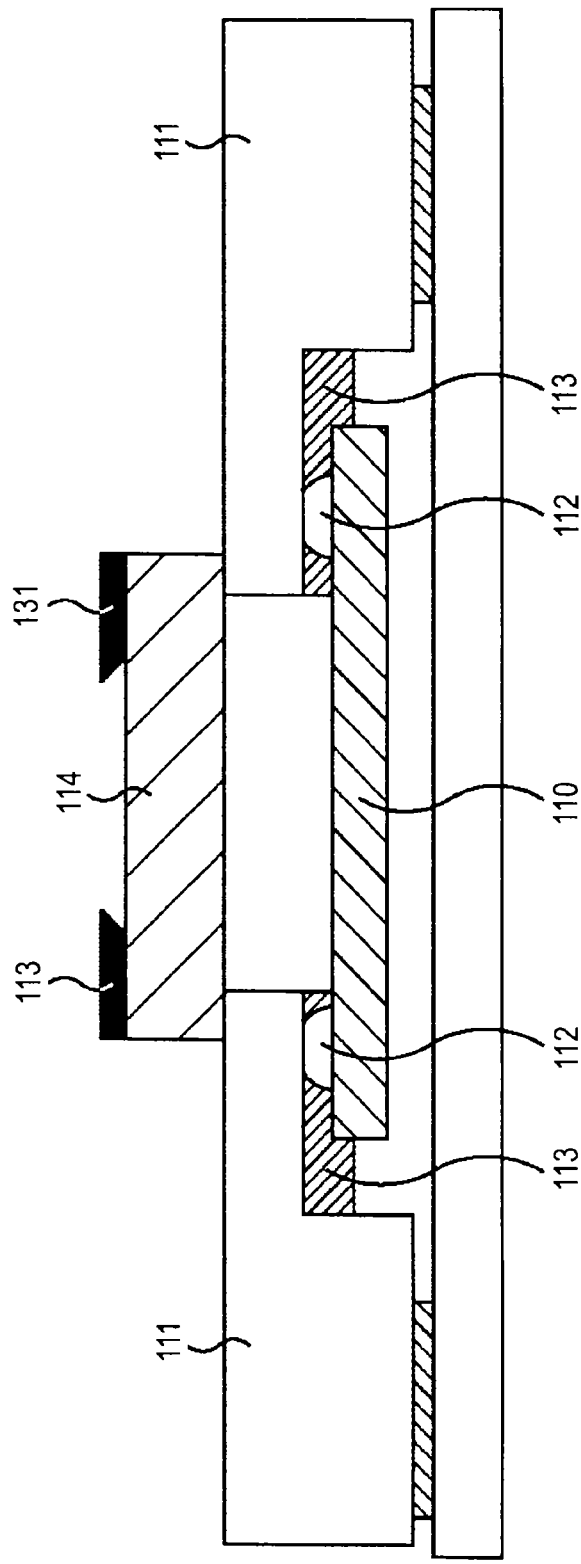
FIG. 10 is a view showing another structure example of the solid-state imaging apparatus of the flip-chip structure.

Though the light shielding member 131 is bonded to the surface of the seal glass 114 facing the image sensor 110 in the above example, however, it is also preferable that the light shielding member 131 is bonded to the surface opposite to the surface (surface facing the lens) of the seal glass 114 facing the image sensor 110 as shown in FIG. 10.

The light receiving surface of the image sensor is exposed in the gap (hereinafter referred to as a cavity) in the above structure of the solid-state imaging apparatus, therefore, the image sensor tends to be affected by dust. In response to this, a solid-state imaging apparatus in a structure not having the cavity (hereinafter referred to as a cavity-less structure) is proposed for reducing effects of dust in the light receiving surface of the image sensor.

Here, an example of the solid-state imaging apparatus of the cavity-less structure to which the present disclosure is applied will be explained.

<3. Example of a Solid-State Imaging Apparatus of a Cavity-Less Structure>

[Cavity-Less Solid-State Imaging Apparatus of the Wire Bonding Structure]

Figure 11:
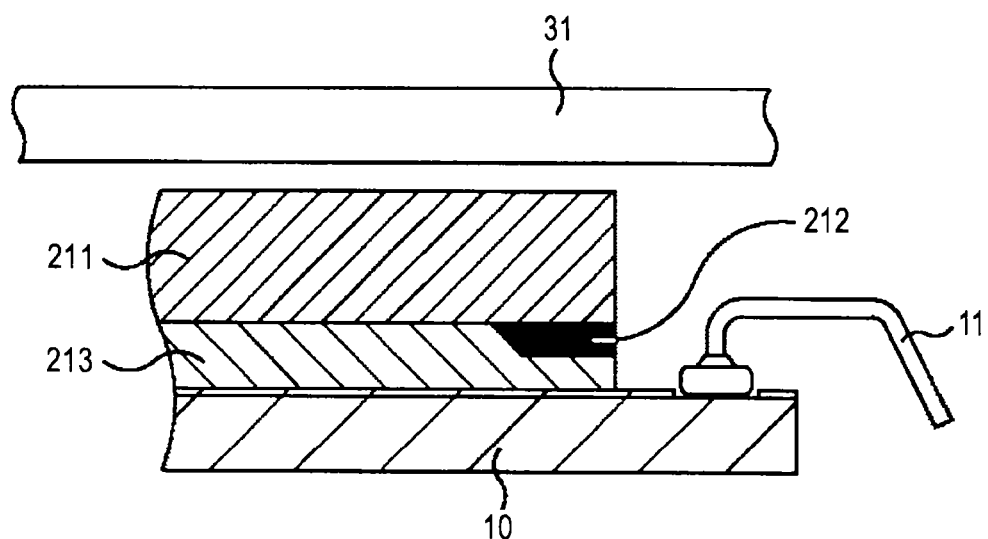
FIG. 11 is a view showing a structure example of a solid-state imaging apparatus in which cavity-less is realized.

FIG. 11 is a view showing a structure of a solid-state imaging apparatus of the wire bonding structure in which cavity-less is realized. In the solid-state imaging apparatus of FIG. 11, components corresponding to components of the solid-state imaging apparatuses of FIG. 3 and so on are denoted by the same symbols.

That is, the solid-state imaging apparatus of FIG. 11 has a structure in which a glass layer 211, a light shielding member 212 and a resin layer 213 are newly provided while removing the light shielding member 13 in the solid-state imaging apparatuses of FIG. 3 and so on.

The glass layer 211 and the resin layer 213 are made of transparent materials transmitting light, refractive indexes of which are higher than air. In the solid-state imaging apparatus of FIG. 11, the cavity is sealed by the glass layer 211 and the resin layer 213 to thereby realize the cavity-less structure.

Moreover, the light shielding member 212 is bonded to a lower surface of the glass layer 211 (surface facing the image sensor 10). The light shielding member 212 is formed by the same material and shape as the above light shielding member 13.

The width (a length in the transverse direction in the drawing) of the light shielding member 212 is designed so that a side surface of the resin layer 213 does not intersect a virtual extension surface of an edge surface of the light shielding member 212. That is, the lower ray transmitted through the edge portion of the opening of the light shielding member 212 is not reflected on the side surface of the resin layer 213.

In manufacturing processes, after the light shielding member 212 is bonded to the lower surface of the glass layer 211, the positioning of the light shielding member 212 is performed with respect to the image sensor 10 in the wafer level, then, the glass layer 211 is bonded to the image sensor 10 with the resin layer 213. Next, dicing is performed to obtain a single piece, then, the glass layer 211 and the resin layer 213 are cut for exposing a bonding pad portion. After that, the exposed bonding pad portion is cleaned to thereby form bonding pads as terminals. It is also preferable that the glass layer 211 is bonded to the image sensor 10 with the resin layer 213 after the image sensor 10 is formed as a chip. In this case, the process of cleaning the exposed bonding pad portion can be omitted.

Also in the solid-state imaging apparatus of the wire bonding structure in which cavity-less is realized in the manner as described above, incident light is not reflected on the edge surface of the light shielding member 212, therefore, it is possible to suppress the generation of flare and ghost due to reflected light from the edge surface of the light shielding member 212.

Moreover, the lower ray transmitted through the edge surface portion of the light shielding member 212 is not reflected on the side surface of the resin layer 213, therefore, it is also possible to suppress the generation of flare and ghost due to reflected light from the side surface of the resin layer 213.

Figure 12:
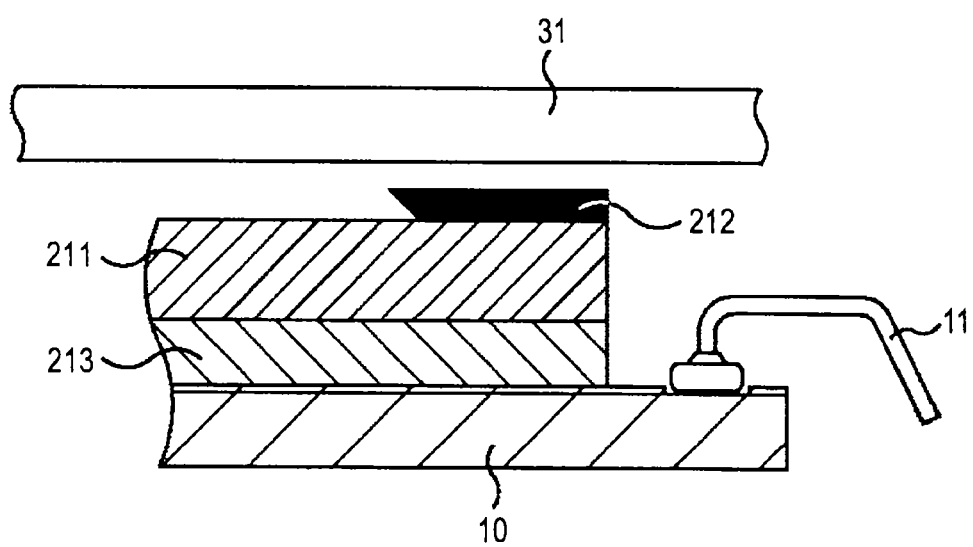
FIG. 12 is a view showing a structure example of the solid-state imaging apparatus in which cavity-less is realized.

The structure in which the light shielding member 212 is bonded to the lower surface of the glass layer 211 has been explained as the above, and it is also preferable to apply a structure in which the light shielding member 212 is bonded to an upper surface of the glass layer 211 as shown in FIG. 12. In this case, the light shielding member 212 can be bonded to the upper surface of the glass layer 211 after the glass layer 211, the resin layer 213 and the image sensor 10 are bonded together, therefore, the accuracy of positioning the light shielding member 212 with respect to the image sensor 10 can be increased. As it is difficult to angle the edge surface of the light shielding member 212 using the wettability with respect to the glass layer 211 in FIG. 12, the light shielding member 212 made of a black-colored film will be applied.

Also in the solid-state imaging apparatus of FIG. 12, the width of the light shielding member 212 (a length in the transverse direction in the drawing) is designed so that the side surfaces of the glass layer 211 and the resin layer 213 do not intersect the virtual extension surface of the edge surface of the light shielding member 212. That is, the lower ray transmitted through the edge portion of the opening of the light shielding member 212 is not reflected on the side surfaces of the glass layer 211 and the resin layer 213.

[Cavity-Less Solid-State Imaging Apparatus of the Flip-Chip Structure]

Figure 13:
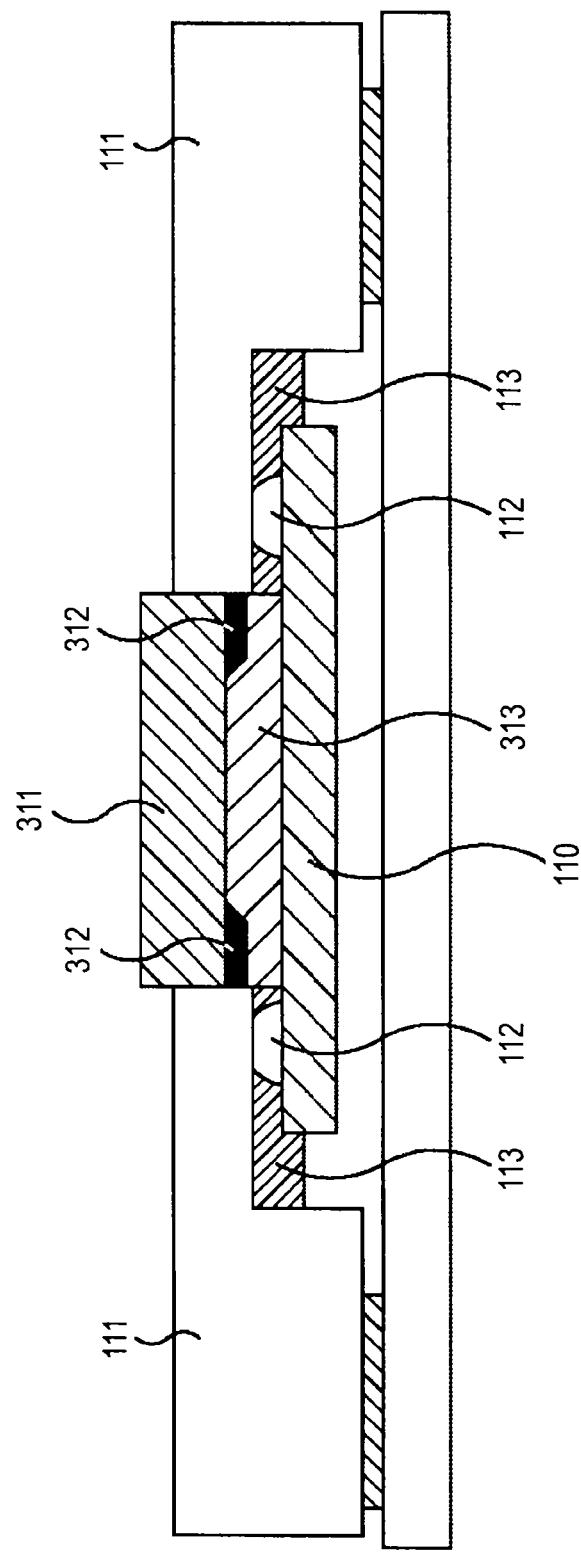
FIG. 13 is a view showing a structure example of the solid-state imaging apparatus in which cavity-less is realized.

FIG. 13 is a view showing a structure of a solid-state imaging apparatus of the flip-chip structure in which cavity-less is realized. In the solid-state imaging apparatus of FIG. 13, components corresponding to components of the solid-state imaging apparatus of FIG. 8 or FIG. 9 are denoted by the same symbols.

That is, the solid-state imaging apparatus of FIG. 13 has a structure in which a glass layer 311, a light shielding member 312 and a resin layer 313 are newly provided while removing the seal glass 114 and the light shielding member 131 in the solid-state imaging apparatus of FIG. 8 of FIG. 9.

The glass layer 311 and the resin layer 313 are made of transparent materials transmitting light, refractive indexes of which are higher than air. In the solid-state imaging apparatus of FIG. 13, the cavity is sealed by the glass layer 311 and the resin layer 313 to thereby realize the cavity-less structure.

Moreover, the light shielding member 312 is bonded to a lower surface of the glass layer 311 (surface facing the image sensor 110). The light shielding member 312 is formed by the same material and shape as the above light shielding member 131.

The width (a length in the transverse direction in the drawing) of the light shielding member 312 is designed so that a side surface of the resin layer 313 does not intersect a virtual extension surface of an edge surface of the light shielding member 312. That is, the lower ray transmitted through the edge portion of the opening of the light shielding member 312 is not reflected on the side surface of the resin layer 313.

In manufacturing processes, after the light shielding member 312 is bonded to the lower surface of the glass layer 311, the positioning of the light shielding member 312 is performed with respect to the image sensor 110 in the wafer level, then, the glass layer 311 is bonded to the image sensor 110 with the resin layer 313. Then, TSV (Through Silicon Via) process for piercing through the chip from the front to the back is performed in the image sensor 110 to thereby realize CSP (Chip Scale Package).

Also in the solid-state imaging apparatus of the flip-chip structure in which cavity-less is realized, incident light is not reflected on the edge surface of the light shielding member 312 or the edge surfaces of the opening of the substrate 111 and the UF 113, therefore, it is possible to suppress the generation of flare and ghost due to reflected light from the edge surface of the light shielding member 312 or the edge surfaces of the opening of the substrate 111 and the UF 113.

Figure 14:
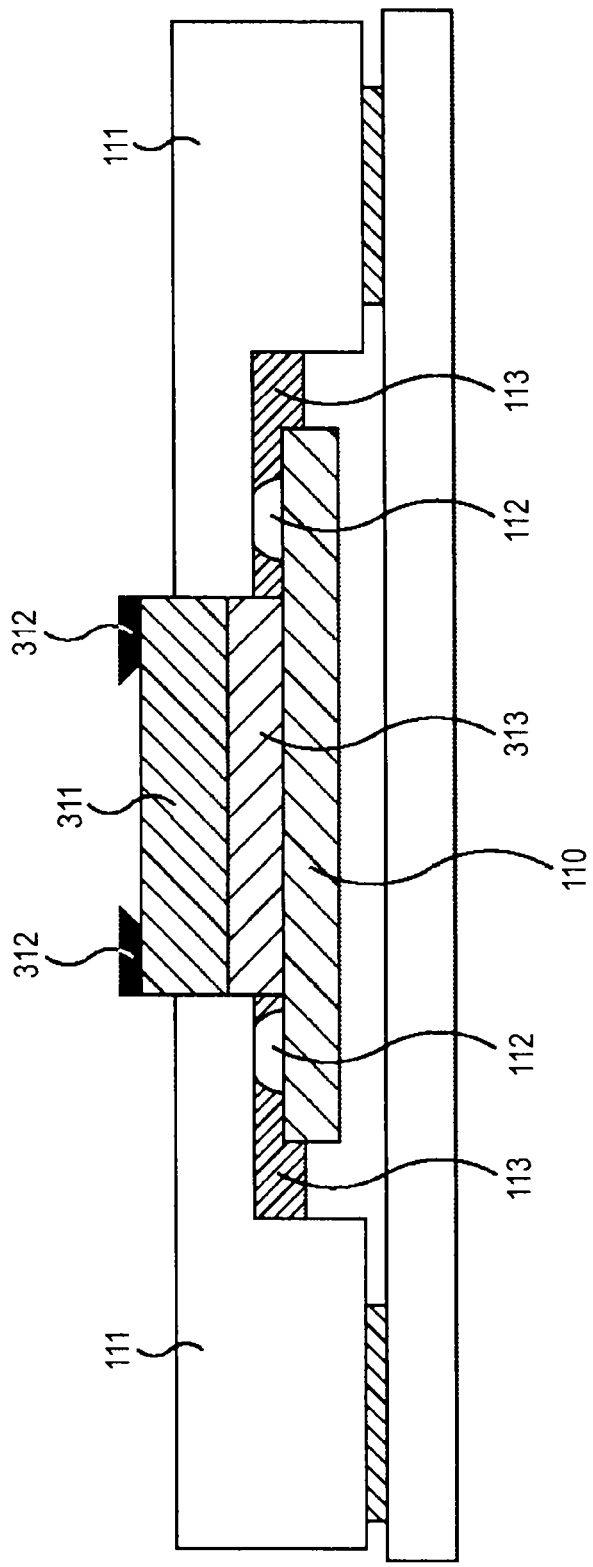
FIG. 14 is a view showing a structure example of the solid-state imaging apparatus in which cavity-less is realized.

The structure in which the light shielding member 312 is bonded to the lower surface of the glass layer 311 has been explained as the above, and it is also preferable to apply a structure in which the light shielding member 312 is bonded to an upper surface of the glass layer 311 as shown in FIG. 14. In this case, the light shielding member 312 can be bonded to the upper surface of the glass layer 311 after the glass layer 311, the resin layer 313 and the image sensor 110 are bonded together, therefore, the accuracy of positioning the light shielding member 312 with respect to the image sensor 110 can be increased. As it is difficult to angle the edge surface of the light shielding member 312 using the wettability with respect to the glass layer 311 in FIG. 14, the light shielding member 312 made of a black-colored film will be applied.

Also in the solid-state imaging apparatus of FIG. 14, the width of the light shielding member 312 (a length in the transverse direction in the drawing) is designed so that the side surfaces of the glass layer 311 and the resin layer 313 do not intersect a virtual extension surface of the edge surface of the light shielding member 312. That is, the lower ray transmitted through the edge portion of the opening of the light shielding member 312 is not reflected on the side surfaces of the glass layer 311 and the resin layer 313.

In the above description, the light shielding member includes the opening through which light incident on the light receiving surface of the image sensor from the lens is transmitted, however, the light shielding member may have structures/shapes corresponding to the arrangement of metal wires in the wire bonding structure or the shape of the opening of the substrate in the flip chip structure. For example, in the case where the bonding pads to which metal wires 11 are connected in the image sensor 10 of FIG. 2 are arranged only on the right side, the light shielding member 13 may have the shape to shield the vicinity of the bonding pads.

Incidentally, in recent camera modules, the effective diameter of the lens is becoming larger as compared with the size of the image sensor for the purpose of shortening a focal length or improving a condensing rate of the lens along with the miniaturization of the camera modules. In such case, the incident angle of incident light from the lens becomes further larger, therefore, it is necessary to increase the edge surface angle of the light shielding member so as to correspond to the incident angle. For example, when the incident angle of incident light from the lens is 45 degrees, it is necessary to increase the edge surface angle of the light shielding member to be larger than 45 degrees.

Figure 6:
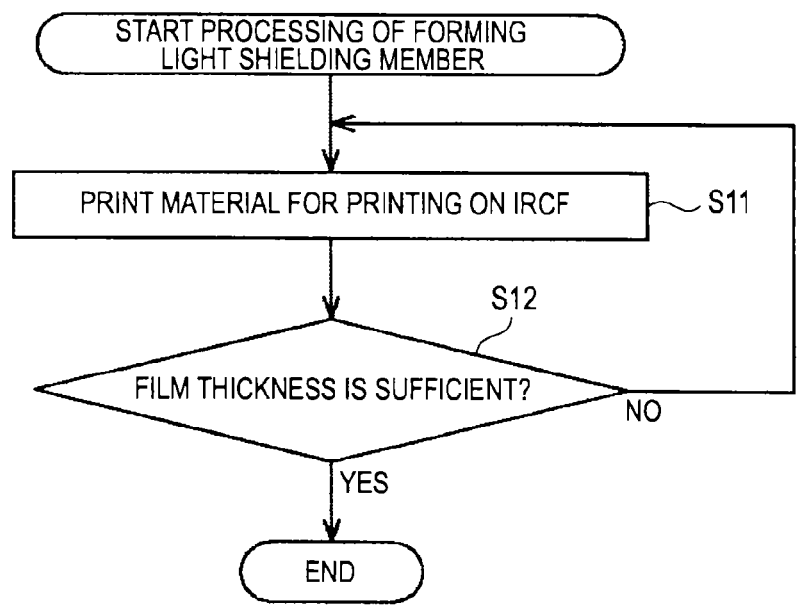
FIG. 6 is a flowchart for explaining processing of forming the light shielding member.

The method of printing the material for printing on the IRCF as one of methods of forming the light shielding member having the edge surface angle has been explained as the above with reference to FIG. 6. However, when the light shielding member is molded by metal molds, for example, it is difficult to form the light shielding member having a large edge surface angle such as 45 degrees, and the edge surface angle will be approximately 30 degrees at the maximum.

Accordingly, an example of forming the light shielding member having a large edge surface angle by metal molds will be explained.

<4. Example of Forming the Light Shielding Member by Metal Molds>

As described above, it is difficult to form the light shielding member having the large edge surface angle by the metal molds, therefore, a given range from an edge portion of the opening of the light shielding member is folded in the direction of the image sensor at a given angle, thereby increasing the edge surface angle.

[Conditions for Suppressing Generation of Flare and Ghost]

Figure 15:
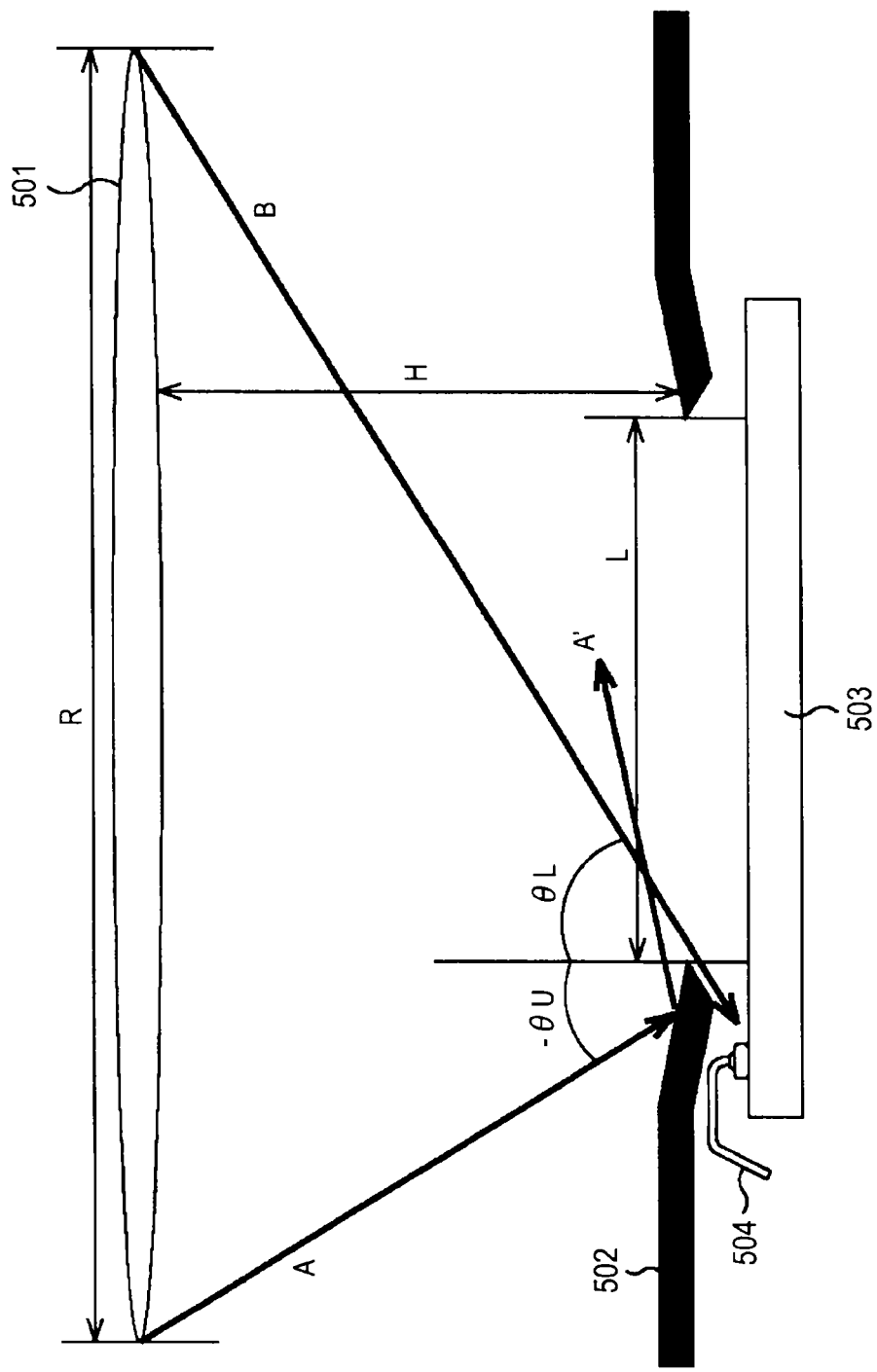
FIG. 15 is a cross-sectional view of a solid-state imaging apparatus in which a periphery of an edge portion of the opening of the light shielding member is folded.

FIG. 15 is a cross-sectional view of a solid-state imaging apparatus in which a given range from the edge portion of the opening of the light shielding member is folded in the direction of the image sensor at a given angle.

In the structure shown in FIG. 15, the following two conditions should be satisfied for suppressing generation of flare and ghost.

(1) A reflected light A' obtained by an upper ray A from a lens 501 being reflected on an upper surface (surface facing the lens) of a portion (hereinafter referred to as a folded portion) of an edge portion of the opening of a light shielding member 502 which is folded in the direction of an image sensor 503 does not enter the image sensor 503.

(2) A lower ray B from the lens 501 is not reflected on the edge surface of the opening of the light shielding member 502 and transmits through the opening of the light shielding member 502. The bonding pads for connecting metal wires 504 are arranged so that the lower ray B transmitted through the opening of the light shielding member 502 is not incident on the pads.

Here, assume that an effective diameter of the lens 501 is "R", an opening diameter of the light shielding member 502 is "L", a distance (focal length) between the lens 501 and the light shielding member 502 is "H", an angle of the folded portion (hereinafter referred to as an folded angle) with respect to the light shielding member 502 is "γ" and an angle (hereinafter referred to as a cut angle) made at the edge surface of the light shielding member 502 by the molding processing is "φ" in the following description. Moreover, assume that the incident angle of the upper ray A is $-\theta U$, the incident angle of the lower ray B is $\theta L$ and the edge surface angle (namely, an angle made between the edge surface of the light shielding member 502 and the optical axis direction of the lens 501) is $\theta M$. "$-\theta U$" as the incident angle of the upper ray A indicates an angle on the opposite side of the incident angle of the upper ray explained with reference to FIG. 5 with respect to the optical axis direction, therefore, a sign of "−" is given.

First, in order to satisfy the condition (1), it is necessary to allow the angle made between the upper ray A and the reflected light A' is lower than $90°-\theta U$.

Figure 16:
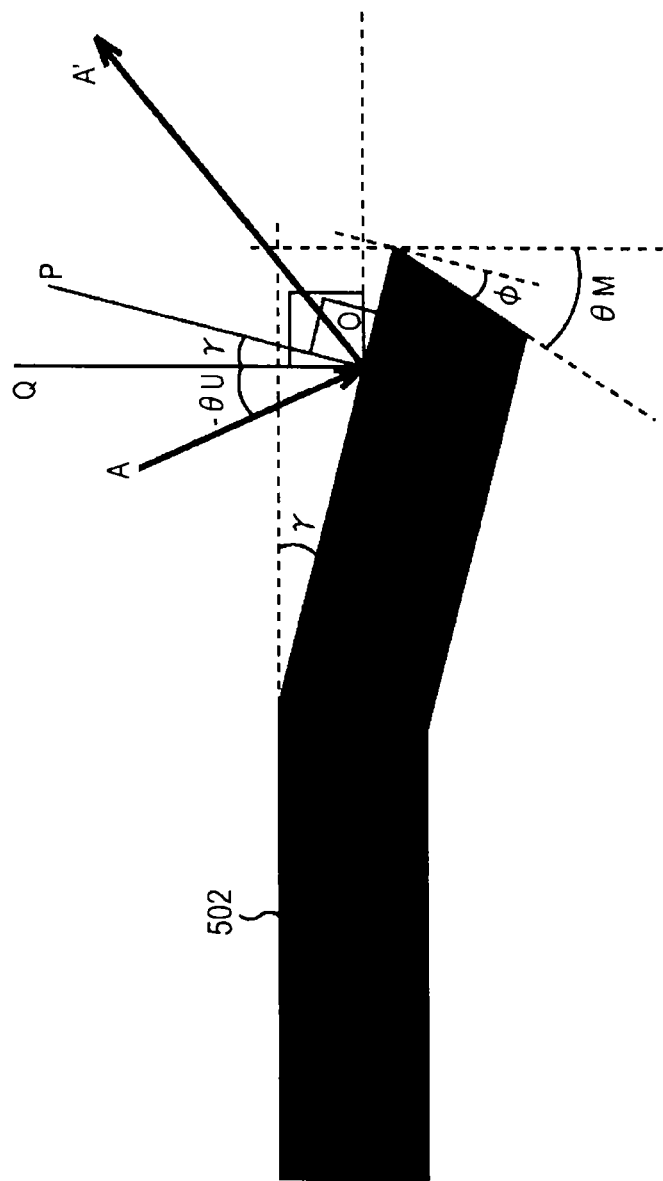
FIG. 16 is a view for explaining conditions of reflection of incident light at an upper surface of a folded portion of the light shielding member.

That is, as shown in FIG. 16, when a segment OP is given in the vertical direction on the upper surface of the folded portion of the light shielding member 502, it is necessary that an angle $\angle AOP$ made between the upper ray A and the segment OP satisfies the following expression (3).

$$\angle AOP \le (90°-\theta U)/2 \qquad (3)$$

When a segment OQ is given in the optical axis direction of the lens 501 on the upper surface of the folding portion of the light shielding member 502, it is necessary that an angle $\angle QOP$ made between the segment OQ and the segment OP satisfies the following expression (4).

$$\angle QOP \le (90°-\theta U)/2 + \theta U = (90°+\theta U)/2 \qquad (4)$$

The angle $\angle QOP$ is equal to the folded angle $\gamma$ and the incident angle $-\theta U$ of the upper ray A is represented by $\arctan\{(R-L)/2H\}$, therefore, the following expression (5) should be satisfied for satisfying the condition (1).

$$\gamma \le [90°-\arctan\{(R-L)/2H\}]/2 \qquad (5)$$

Figure 17:
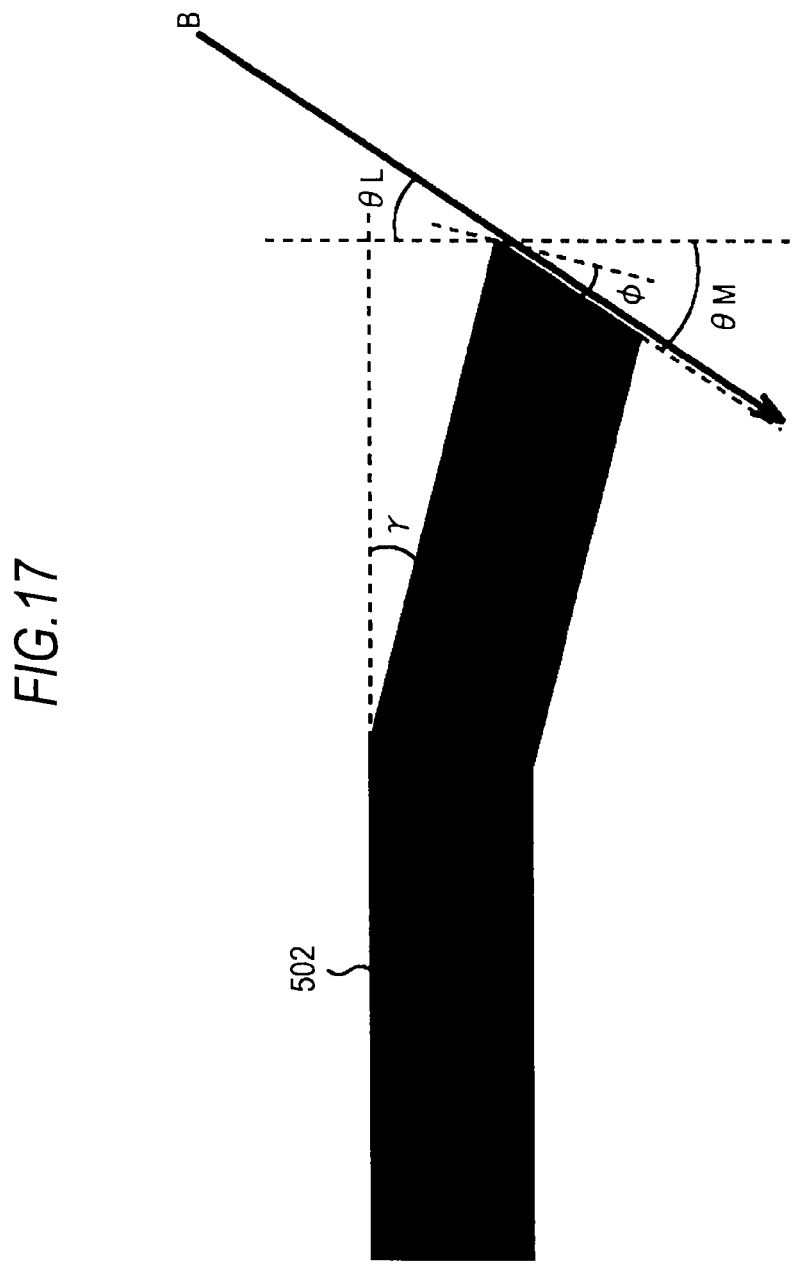
FIG. 17 is a view for explaining conditions of transmission of incident light at the edge surface of the opening of the light shielding member.

Next, $\theta L \le \theta M$ should be satisfied for satisfying the above condition (2) as shown in FIG. 17. Here, the incident angle $\theta L$ of the lower ray B is represented by arctan {(R+L)/2H}, therefore, the following expression (6) should be satisfied for satisfying the condition (2).

$$\arctan\{(R+L)/2H\} \leq \theta M \quad (6)$$

As described above, the expression (5) and the expression (6) should be satisfied for satisfying the condition (1) and the condition (2).

Incidentally, it is necessary that the edge surface angle θM and the folded angle γ satisfy the relation of θM>γ, the cut angle φ should be made at the edge surface of the light shielding member 502 so as to satisfy θM−γ≤φ.

That is, when the effective diameter R of the lens, the opening diameter L of the light shielding member 502 and the focal length H are fixed by the above expression (5) and the expression (6), the edge surface angle θM and the folded angle γ satisfying the condition (1) and the condition (2) are fixed, therefore, the minimum value of the cut angle φ to be made at the edge surface of the light shielding member 502 can be fixed.

Figure 18C:
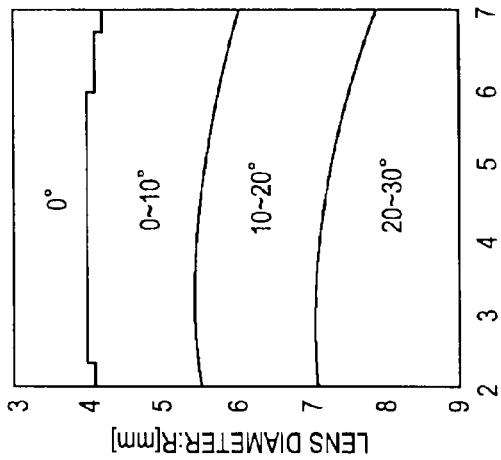
FIGS. 18A to 18C shows graphs for explaining values of an cut angle to be made at the edge surface of the opening of the light shielding member.
Figure 18B:
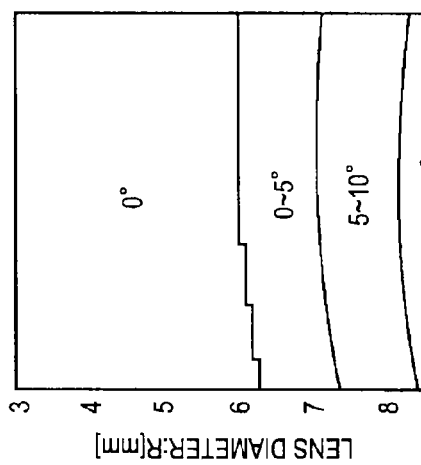
Figure 18A:
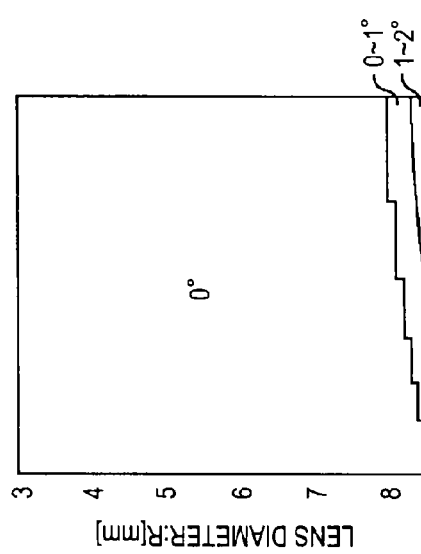

FIGS. 18A to 18C are graphs explaining ranges of values of the cut angle φ when the effective diameter R of the lens, the opening diameter L (opening of a light shielding plate) of the light shielding member 502 and the focal length H are fixed.

FIG. 18A shows the range of values of the cut angle φ when the focal length H is 8 mm, FIG. 18B shows the range of values of the cut angle φ when the focal length H is 6 mm. FIG. 18C shows the range of values of the cut angle φ when the focal length H is 4 mm.

Even when the focal length H is reduced and the lens diameter R is increased, values of the cut angle φ are in a range from 20° to 30° particularly shown in FIG. 18C, which are values at which the device can be formed by the metal molds. That is, when the folded portion is provided at the edge portion of the light shielding member, the light shielding member having the large edge surface angle can be formed by the metal molds to thereby suppress the generation of flare and ghost.

[Processing of Forming the Light Shielding Member by Metal Molds]

Next, the above-described processing of forming the light shielding member 502 by the metal molds will be explained with reference to FIG. 19 to FIG. 24B. FIG. 19 is a flowchart explaining the processing of forming the light shielding member by the metal molds and FIGS. 20A and 20B to FIGS. 24A and 24B are cross-sectional views of the light shielding member 502 and so on processed in the processing of forming the light shielding member.

First, in Step S111, an opening and a guide hole for positioning are formed in a plate material to be the light shielding member 502.

The light shielding member 502 shown in FIG. 20A is, for example, a plate-shaped member generated by mixing a powder carbon into a resin such as polyester. The plate-shaped light shielding member 502 is cut so as to open wide on one surface (the surface facing the image sensor) by metal molds 551 and 552 to thereby form an opening 502a as shown in FIG. 20B. At this time, a guide hole 502b is formed at the same time. Here, a single-edged blade is used for cutting the opening 502a to utilize suppleness in the metal die 552, thereby forming the opening 502a with the cut angle φ of approximately 30 degrees.

In Step S112, the opening 502a is pressed so that the folded portion is formed in the opening 502a of the light shielding member 502.

That is, as shown in FIG. 21, the opening 502a is pressed by the metal molds 561 and 562 to thereby form the folded portion in the opening 502a of the light shielding member 502. At this time, the light shielding member 502 is positioned with respect to the metal molds 561 and 562 by the guide hole 502b.

In Step S113, an adhesive tape for supporting the light shielding member 502 on the image sensor is formed.

As shown in FIG. 22A, an adhesive tape 581 includes a protection tape 581a, an adhesive layer 581b and a protection tape 581c which are stacked.

First, as shown in FIG. 22B, an opening 581d, a guide hole 581e and a cut 581f are formed in the adhesive tape 581 by metal molds 591 and 592.

Figure 23A:
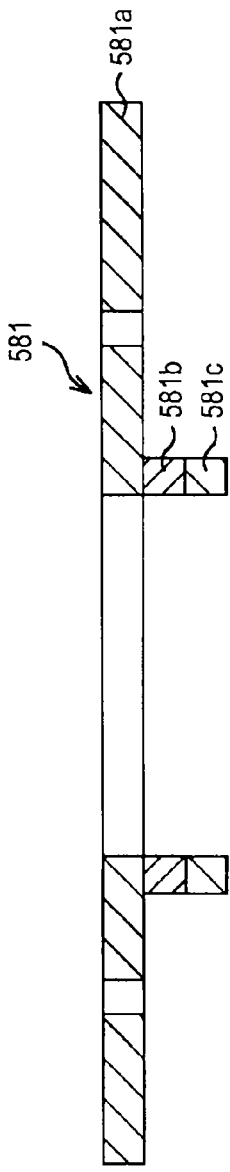
FIGS. 23A to 23C are views for explaining formation of the light shielding member by metal molds.

Next, as shown in FIG. 23A, unnecessary portions of the adhesive layer 581b and the protection tape 581c are peeled off by the cut 581f formed in the adhesive tape 581.

Figure 23B:
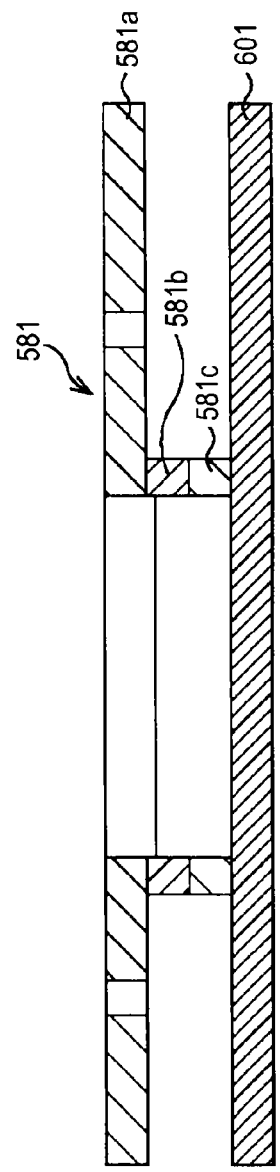
Figure 23C:
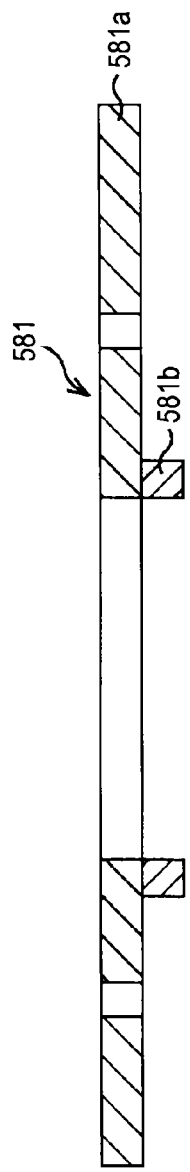

Then, as shown in FIG. 23B, another protection tape 601 is attached to the protection tape 581c of the adhesive tape 581 from which the unnecessary portions are peeled off, thereby peeling off the protection tape 581c.

In the manner as described above, the adhesive tape 581 shown in FIG. 23C is formed.

Return to the flowchart of FIG. 19, the light shielding member 502 and the adhesive tape 581 are bonded to each other in Step S114. That is, as shown in FIG. 24A, the upper surface (surface facing the lens) of the light shielding member 502 and the adhesive take 581 are bonded to each other by the adhesive layer 581b as shown in FIG. 24A.

Then, in Step S115, an unnecessary portion of the light shielding member 502 is cut. That is, as shown in FIG. 24B, the unnecessary portion including the guide hole 502b of the light shielding member 502 bonded to the adhesive tape 581 is cut by metal molds 611 and 612, thereby forming an outer shape of the light shielding member 502.

According to the above processing, it is possible to form the light shielding member having the shape in which the folded portion is formed at the opening as well as the cut angle is made at the edge surface.

The light shielding member having the similar shape can be formed by etching metals or other methods, however, costs are extremely high. On the other hand, the light shielding member can be formed by cutting and pressing resin materials such as plastic by metal molds according to the above processing, therefore, the light shielding member can be manufactured inexpensively as well as on a massive scale, which can reduce costs for manufacturing the camera module.

The present disclosure is not limited to the above embodiment and can be variously modified within a scope not departing from the gist of the present disclosure.

Furthermore, the present disclosure can apply the following configurations.

(1) A solid-state imaging apparatus including a solid-state imaging device photoelectrically converting light taken by a lens, and a light shielding member shielding part of light incident on the solid-state imaging device from the lens, in which an angle made between an edge surface of the light shielding member and an optical axis direction of the lens is larger than an incident angle of light to be incident on an edge portion of the light shielding member.

(2) The solid-state imaging apparatus described in the above (1), in which the angle made between the edge surface of the light shielding member and the optical axis direction of the lens is larger than the incident angle of light whose incident angle is the largest of light incident on the edge portion of the light shielding member.

(3) The solid-state imaging apparatus described in the above (1) or (2), in which pads to which metal wires connected to a substrate are connected are provided at an peripheral portion of a light receiving surface of the solid-state imaging device, and the pads are not arranged on an area closer to the light receiving surface in areas defined by an intersection between a surface of the solid-state imaging device and a virtual extension surface of the edge surface of the light shielding member.

(4) The solid-state imaging apparatus described in the above (1) or (2), in which the light receiving surface of the solid-state imaging device receives light incident from an opening of the substrate having the opening, and an edge surface of the opening does not intersect the virtual extension surface of the edge surface of the light shielding member.

(5) The solid-state imaging apparatus described in the above (3) or (4), further including a sealing member sealing a gap on the light receiving surface of the solid-state imaging device, in which the light shielding member is provided on a surface of the sealing member facing the lens or a surface thereof facing the solid-state imaging device.

(6) The solid-state imaging apparatus described in the above (5), in which a side surface of the sealing member does not intersect the virtual extension surface of the edge surface of the light shielding member.

(7) The solid-state imaging apparatus described in the above (2), in which the shielding member is formed by printing a material for printing on an optical filter arranged on an optical path once or plural times.

The present disclosure contains subject matter related to those disclosed in Japanese Priority Patent Applications JP 2011-033690 and JP 2011-105241 filed in the Japan Patent Office on Feb. 18, 2011 and May 10, 2011, respectively, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
   a solid-state imaging device photoelectrically converting light taken by a lens;
   a light shielding member shielding part of light incident on the solid-state imaging device from lens; and
   a sealing member sealing a gap on the light receiving surface of the solid-state imaging device,
   wherein the light shielding member has an opening, a first size of the opening facing the solid-state imaging device is greater than a second size of the opening facing the lens, and
   wherein an edge surface of the opening of the light shielding member forms an angle with respect to an optical axis direction of the lens, and
   wherein the light shielding member is provided on a surface of the sealing member facing the lens or a surface thereof facing the solid-state imaging device.

2. The imaging device according to claim 1,
   wherein the angle made between the edge surface of the light shielding member and the optical axis direction of the lens is larger than the incident angle of light whose incident angle is the largest of light incident on the edge portion of the light shielding member.

3. The imaging device according to claim 2,
   wherein pads to which metal wires connected to a substrate are connected are provided at an peripheral portion of a light receiving surface of the solid-state imaging device, and
   wherein the pads are not arranged on an area closer to the light receiving surface in areas defined by an intersection between a surface of the solid-state imaging device and a virtual extension surface of the edge surface of the light shielding member.

4. The imaging device according to claim 2,
   wherein the light receiving surface of the solid-state imaging device receives light incident from an opening of a substrate having the opening, and
   an edge surface of the opening does not intersect the virtual extension surface of the edge surface of the light shielding member.

5. The imaging device according to claim 1,
   wherein a side surface of the sealing member does not intersect the virtual extension surface of the edge surface of the light shielding member.

6. The imaging device according to claim 2,
   wherein the light shielding member is formed by printing a material for printing on an optical filter arranged on an optical path once or plural times.

7. The imaging device according to claim 1,
   wherein the angle made between the edge surface of the light shielding member and the optical axis is 50 degrees.

8. The imaging device according to claim 1,
   wherein the light shielding member is made of an antireflection film.

9. The imaging device according to claim 8, wherein the light shielding member is colored black.

10. The imaging device according to claim 1, wherein the light shielding member is colored black.

11. The imaging device according to claim 8, wherein the light shielding member has UV curability or heat curability.

12. The imaging device according to claim 11, wherein the light shielding member is made of a material selected from the group consisting of a carbon filler, epoxy resin or acrylic resin colored black with dye and an epoxy/acrylic hybrid resin.

13. The imaging device according to claim 2, further comprising;
    an optical member arranged on an optical path between the lens and the solid-state image device,
    wherein the light shielding member is bonded to a surface of the optical member facing the solid-state imaging device.

14. The imaging device according to claim 13, wherein the optical member is an infrared ray cut filter.

15. The imaging device according to claim 13, further comprising:
    a bonding pad arranged on a peripheral portion of the solid-state imaging device excluding a light receiving surface,
    wherein the solid-state imaging apparatus is configured to satisfy the following expressions: $\theta M > \arctan[\tan\theta U + \{(D-2\sigma)/G\}]$, wherein $\theta M$ is the angle made between the edge surface of the light shielding member and the optical axis, $\theta U$ is an incident angle of an upper ray, $D$ is a distance between the edge portion of the light receiving surface and the bonding pad, $\sigma$ is a deviation from a position in design of the light shielding member, and G is a gap length between the optical member and the solid-state imaging device.

16. The imaging device according to claim 13, wherein the sealing member is made of transparent materials transmitting light.

17. The imaging device according to claim 16, wherein the sealing member is made of glass or resin.

18. An electronic apparatus comprising:
a solid-state imaging device photoelectrically converting light taken by a lens;
a light shielding member shielding part of light incident on the solid-state imaging device from lens; and
a sealing member sealing a gap on the light receiving surface of the solid-state imaging device,
wherein the light shielding member has an opening, a first size of the opening facing the solid-state imaging device is greater than a second size of the opening facing the lens,
wherein an edge surface of the opening of the light shielding member forms an angle with respect to an optical axis direction of the lens, and
wherein the light shielding member is provided on a surface of the sealing member facing the lens or a surface thereof facing the solid-state imaging device.

19. The electronic apparatus according to claim 18,
wherein the angle made between the edge surface of the light shielding member and the optical axis direction of the lens is larger than the incident angle of light whose incident angle is the largest of light incident on the edge portion of the light shielding member.

20. The electronic apparatus according to claim 19,
wherein pads to which metal wires connected to a substrate are connected are provided at an peripheral portion of a light receiving surface of the solid-state imaging device, and
wherein the pads are not arranged on an area closer to the light receiving surface in areas defined by an intersection between a surface of the solid-state imaging device and a virtual extension surface of the edge surface of the light shielding member.

21. The electronic apparatus according to claim 19,
wherein the light receiving surface of the solid-state imaging device receives light incident from an opening of a substrate having the opening, and
an edge surface of the opening does not intersect the virtual extension surface of the edge surface of the light shielding member.

22. The electronic apparatus according to claim 18,
wherein a side surface of the sealing member does not intersect the virtual extension surface of the edge surface of the light shielding member.

23. The electronic apparatus according to claim 19,
wherein the light shielding member is formed by printing a material for printing on an optical filter arranged on an optical path once or plural times.

24. The electronic apparatus according to claim 18,
wherein the angle made between the edge surface of the light shielding member and the optical axis is 50 degrees.

25. The electronic apparatus according to claim 18,
wherein the light shielding member is made of an antireflection film.

26. The electronic apparatus according to claim 25, wherein the light shielding member is colored black.

27. The electronic apparatus according to claim 18, wherein the light shielding member is colored black.

28. The electronic apparatus according to claim 25, wherein the light shielding member has UV curability or heat curability.

29. The electronic apparatus according to claim 28,
wherein the light shielding member is made of a material selected from the group consisting of a carbon filler, epoxy resin or acrylic resin colored black with dye and an epoxy/acrylic hybrid resin.

30. The electronic apparatus according to claim 19, further comprising;
an optical member arranged on an optical path between the lens and the solid-state image device,
wherein the light shielding member is bonded to a surface of the optical member facing the solid-state imaging device.

31. The electronic apparatus according to claim 30, wherein the optical member is an infrared ray cut filter.

32. The electronic apparatus according to claim 30, further comprising:
a bonding pad arranged on a peripheral portion of the solid-state imaging device excluding a light receiving surface,
wherein the solid-state imaging apparatus is configured to satisfy the following expressions: $\theta M > \arctan[\tan\theta U + \{(D-2\sigma)/G\}]$, wherein $\theta M$ is the angle made between the edge surface of the light shielding member and the optical axis, $\theta U$ is an incident angle of an upper ray, D is a distance between the edge portion of the light receiving surface and the bonding pad, $\sigma$ is a deviation from a position in design of the light shielding member, and G is a gap length between the optical member and the solid-state imaging device.

33. The electronic apparatus according to claim 30, wherein the sealing member is made of transparent materials transmitting light.

34. The electronic apparatus according to claim 33, wherein the sealing member is made of glass or resin.

* * * * *